US 7,164,463 B2

(12) United States Patent
Galburt et al.

(10) Patent No.: US 7,164,463 B2
(45) Date of Patent: *Jan. 16, 2007

(54) LITHOGRAPHIC TOOL WITH DUAL ISOLATION SYSTEM AND METHOD FOR CONFIGURING THE SAME

(75) Inventors: Daniel N. Galburt, Wilton, CT (US); Peter C. Kochersperger, Easton, CT (US)

(73) Assignee: ASML Holding N.V., Veldhoven (NL)

( * ) Notice: Subject to any disclaimer, the term of this patent is extended or adjusted under 35 U.S.C. 154(b) by 0 days.

This patent is subject to a terminal disclaimer.

(21) Appl. No.: 10/369,569

(22) Filed: Feb. 21, 2003

(65) Prior Publication Data

US 2003/0164931 A1 Sep. 4, 2003

Related U.S. Application Data

(63) Continuation of application No. 09/794,133, filed on Feb. 28, 2001, now Pat. No. 6,538,720.

(51) Int. Cl.
*G03B 27/42* (2006.01)
*G03B 27/32* (2006.01)
*G03F 9/00* (2006.01)
*F16M 13/00* (2006.01)

(52) U.S. Cl. .......................... 355/53; 355/77; 248/636; 430/22

(58) Field of Classification Search .................. 355/53, 355/67, 72, 77; 248/638; 310/12; 430/22
See application file for complete search history.

(56) References Cited

U.S. PATENT DOCUMENTS

| 4,952,858 A | 8/1990 | Galburt |
| 5,285,142 A | 2/1994 | Galburt et al. |

| 5,835,195 A | * 11/1998 | Gibson et al. .................. 355/53 |

(Continued)

FOREIGN PATENT DOCUMENTS

| EP | 1 041 607 A1 | 4/2000 |
| WO | WO 00/14779 | * 3/2000 |

OTHER PUBLICATIONS

U.S. Appl. No. 10/095,070, filed Feb. 28, 2001, Daniel N. Galburt.
Copy of Search Report for European Application No. 02 004 557.1, issued on Jan. 7, 2005.
English Abstract for Japanese Patent Publication No. 2001-35773, 1 page, provided by the European Patent Office, Copyright 2001 (JPO).
English Abstract for Japanese Patent Publication No. 8-306617, 1 page, provided by the European Patent Office, Copyright 1996 (JPO).

*Primary Examiner*—Alan Mathews
(74) *Attorney, Agent, or Firm*—Sterne, Kessler, Goldstein & Fox P.L.L.C.

(57) ABSTRACT

An apparatus, system, and method for configuring a dual isolation system lithography tool is described. An isolated base frame is supported by a non-isolated tool structure. A wafer stage component is supported by the isolated base frame. The wafer stage component provides a mount for a semiconductor wafer. A reticle stage component is supported by the isolated base frame. The reticle stage component provides a mount for a reticle. An isolated bridge provides a mount for a projection optics. The isolated bridge is supported by the isolated base frame. Alternatively, an isolated bridge is supported by a non-isolated base frame. A wafer stage component is supported by the non-isolated base frame. A reticle stage component is supported by the non-isolated base frame. An isolated optical relay is supported by the non-isolated base frame. The isolated optical relay includes one or more individually servo controlled framing blades.

39 Claims, 24 Drawing Sheets

U.S. PATENT DOCUMENTS

| | | | |
|---|---|---|---|
| 5,931,441 A | 8/1999 | Sakamoto | |
| 6,036,162 A * | 3/2000 | Hayashi | 248/550 |
| 6,285,444 B1 * | 9/2001 | Osanai et al. | 355/72 |
| 6,307,619 B1 | 10/2001 | Galburt et al. | |
| 6,327,024 B1 | 12/2001 | Hayashi et al. | |
| 6,329,780 B1 | 12/2001 | Ebihara et al. | |
| 6,388,733 B1 * | 5/2002 | Hayashi | 355/53 |
| 6,493,062 B1 * | 12/2002 | Tokuda et al. | 355/53 |
| 6,538,719 B1 * | 3/2003 | Takahashi et al. | 355/53 |
| 6,538,720 B1 * | 3/2003 | Galburt et al. | 355/53 |
| 2003/0117600 A1 | 6/2003 | Taniuchi et al. | |
| 2003/0142281 A1 * | 7/2003 | Nishi | 355/53 |

\* cited by examiner

FRONT VIEW – (RETICLE STAGE NOT SHOWN)

SIDE VIEW
(1X RELAY ISOLATION COMPONENTS NOT SHOWN)

FRONT VIEW
(RETICLE STAGE AND 1X RELAY NOT SHOWN)

LITHOGRAPHIC TOOL WITH DUAL ISOLATION SYSTEM AND METHOD FOR CONFIGURING THE SAME

This is a continuation application of U.S. application Ser. No. 09/794,133, filed Feb. 28, 2001, now U.S. Pat. No. 6,538,720 is herein incorporated by reference in its entirety.

BACKGROUND OF THE INVENTION

1. Field of the Invention

The present invention is related to lithography systems and, more particularly, to reducing relative motion between components of a lithography tool.

2. Related Art

In the fabrication of integrated circuits, lithographic and projection printing techniques are used. Lithography is a process used to create features on the surface of substrates. Such substrates can include those used in the manufacture of flat panel displays, circuit boards, various integrated circuits, and the like. A frequently used substrate for such applications is a semiconductor wafer. During lithography, exposure optics located within a lithography apparatus project an image in a reticle onto the surface of a semiconductor wafer. The wafer is disposed on a wafer stage. The projected image produces changes in the characteristics of a layer of the wafer. For instance, a photoresist layer deposited on the surface of the wafer is etched with a pattern during the process.

Step-and-scan lithography techniques may be used to expose a wafer. Rather than expose the entire wafer at one time, individual fields are scanned onto the wafer, one at a time. This is done by moving the wafer and reticle simultaneously such that an imaging slot is moved across each field during the scan. The wafer stage is stepped between field exposures to allow multiple copies of the reticle pattern to be exposed over the wafer surface.

As described above, components are required to move in step-and-scan lithography systems. Acceleration of system components during their movement can cause a reaction load or reaction movement in components of the system being moved against, and in the support structure. Reaction movements or reaction loads lead to relative motion between critical components, which leads to reduced operational precision for the lithography system. Hence, what is needed is a method, system, and apparatus for reducing reaction loads, and relative motion among lithography system components.

SUMMARY OF THE INVENTION

The present invention is directed towards an apparatus, system, and method for configuring a lithography tool with a dual isolation system. In one aspect, an isolated base frame is supported by a non-isolated tool structure. A wafer stage component is supported by the isolated base frame. The wafer stage component provides a mount for attachment of a semiconductor wafer. A reticle stage component is supported by the isolated base frame. The reticle stage component provides a mount for a reticle. An isolated bridge provides a mount for a projection optics. The isolated bridge is supported by the isolated base frame. Radiation from an illumination source passes through a reticle mounted at the provided reticle mount to a surface of an attached semiconductor wafer. A pattern of a mounted reticle is transferred to a surface of an attached semiconductor wafer.

In another aspect, an isolated bridge provides a mount for a projection optics. The isolated bridge is supported by a non-isolated base frame. A wafer stage component is supported by the non-isolated base frame. The wafer stage component provides a mount for attachment of a semiconductor wafer. A reticle stage component is supported by the non-isolated base frame. The reticle stage component provides a mount for a reticle. An isolated optical relay is supported by the non-isolated base frame. The isolated optical relay includes at least one servo controlled framing blade. The one or more servo controlled framing blades are configured such that radiation from an illumination source would be framed and imaged onto a reticle mounted at the provided reticle mount. The radiation would pass through the reticle plane to a surface of an attached semiconductor wafer. A pattern of a mounted reticle would be transferred to an attached semiconductor wafer surface.

Further aspects of the present invention, and further features and benefits thereof, are described below. The accompanying drawings, which are incorporated herein and form a part of the specification, illustrate the present invention and, together with the description, further serve to explain the principles of the invention and to enable a person skilled in the pertinent art to make and use the invention.

BRIEF DESCRIPTION OF THE FIGURES

In the drawings, like reference numbers indicate identical or functionally similar elements. Additionally, the left-most digit(s) of a reference number identifies the drawing in which the reference number first appears.

Figure 1A:
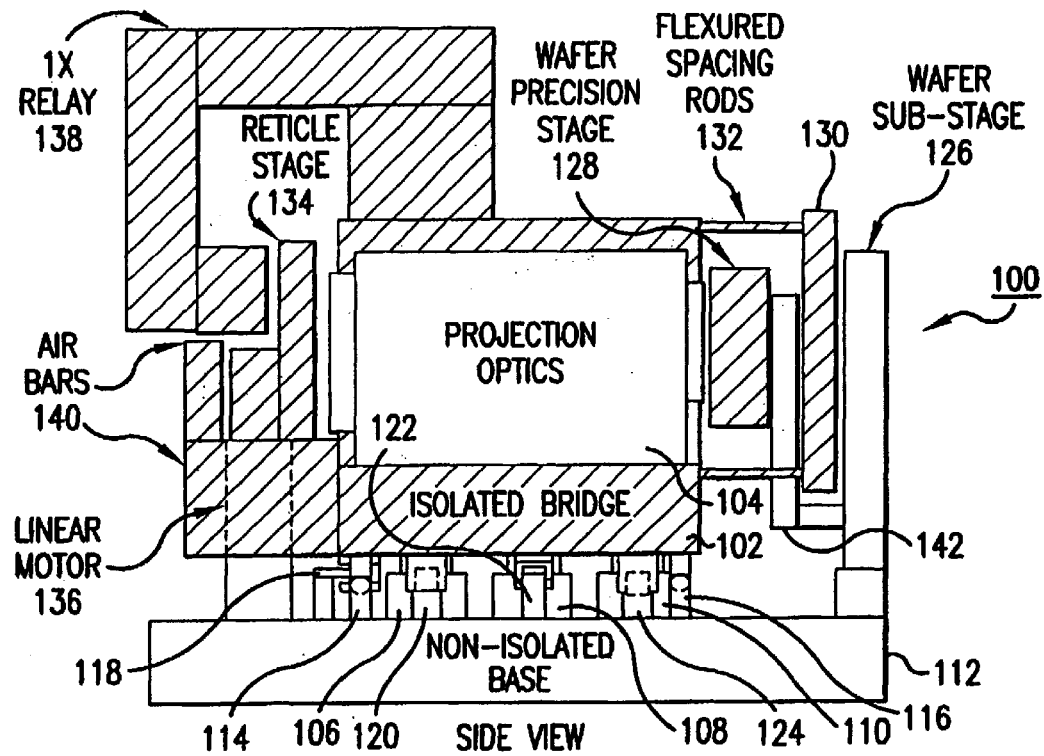
FIGS. 1A and 1B respectively illustrate side and front views of a lithographic tool apparatus 100.

The present invention will now be described with reference to the accompanying drawings.

DETAILED DESCRIPTION OF THE PREFERRED EMBODIMENTS

Table of Contents

1. Overview
2. Example Lithography System
3. Example Lithography Tool Isolation System Configuration
    3.1 Example Wafer Stage Configuration
    3.2 Example Reticle Stage Configuration
    3.3 Non-contact Magnetic Force Actuators
    3.4 Non-contact Relative Position Sensors
    3.5 Pneumatic Isolators, and Counter Force Devices
    3.6 Mechanical Properties of an Isolated Structure
    3.7 Six-Axis Position Control Servos
4. Advanced Lithography Tool with Dual Isolation System Embodiments of the Present Invention
5. Advanced Lithography Tool with Separately Isolated Bridge and Relay Structures Embodiments of the Present Invention

1. Overview

The present invention is directed to a method, system, and apparatus for reducing relative motion between critical elements of a lithography tool. The present invention uses multiple isolated systems to reduce motion loads, and relative motion between critical components, including components such as those included in a wafer stage, a reticle stage, and projection optics. By reducing motion loads, and relative motion between one or more lithography system components, semiconductor wafers may be more precisely and repeatedly etched according to tighter tolerances.

In an embodiment according to the present invention, two active isolated structural assemblies are provided. The first isolated structure, an isolated bridge, mounts projection optics and passive components of the wafer and reticle stage metrology systems. According to the present invention, no significant wafer or reticle stage motion loads are present on the isolated bridge assembly. The second isolated structure, an isolated base frame, supports active components of the wafer and reticle stage, and carries all stage motion related loads. The isolated base frame also supports the isolated bridge. A non-isolated tool structure supports the isolated base frame and isolated bridge combination.

In a preferred embodiment, the isolated bridge is servo controlled to remain stationary relative to the non-isolated tool structure at low frequencies. At higher frequencies, the position of the isolated bridge is stabilized by active inertial sensor feedback signals.

In the preferred embodiment, in a counter-intuitive fashion, the isolated base frame is servo controlled to follow the position of the isolated bridge. The servo control for the isolated base frame includes anti-rock features that transfer reticle and wafer stage motion-related loads to the non-isolated tool support structure, without coupling floor motion on to the isolated base frame structure.

Furthermore, in yet another embodiment, the wafer stage does not include a focus back plate, and in general, provides improved isolation from floor vibration.

In an alternative embodiment according to the present invention, a lithography tool with a separately isolated bridge and relay structure is presented. Unlike conventional implementations, separate servo controlled framing blades are located in the relay module, and are imaged onto the reticle plane. In an embodiment, the relay has a magnification factor of 1×. Relative motion between the relay and the bridge must be controlled to the micron level, while motion loads related to framing blades are isolated from the critical bridge structure. To achieve this, the lithography tool of the present invention utilizes a dual isolation system, where the bridge and relay structures are independently supported by active six-degrees of freedom isolation systems. The relay is servo controlled to closely track the position of an isolated bridge structure. The relay servo incorporates anti-rock compensation to counter the effects of framing blade motion loads.

A lithography system is presented in the following section. An example lithography tool isolation system configuration is then provided. An advanced lithography tool with dual isolation system of the present invention is described in the subsequent section. Finally, an advanced lithography tool with a separately isolated bridge and relay structure is described, according to the present invention.

2. Example Lithography System

Figure 9:
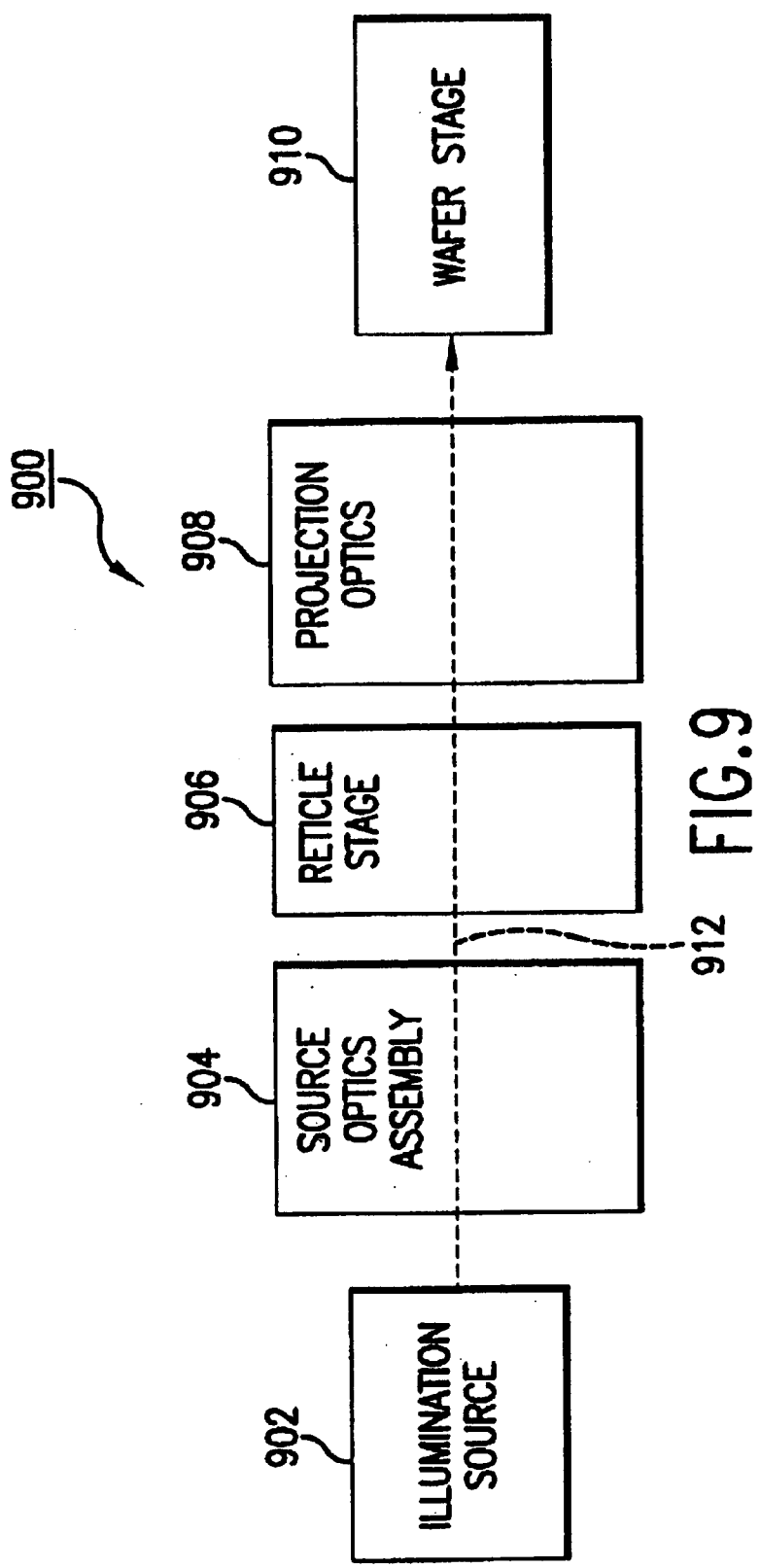
FIG. 9 illustrates relevant portions of a lithography system.

FIG. 9 illustrates relevant portions of a lithography system 900. Lithography system 900 includes an illumination source 902, a source optics assembly 904, a reticle stage 906, a projection optics 908, and a wafer stage 910. Illumination source 902 includes a source of radiation for exposing a semiconductor wafer surface of wafer stage 910. Source optics assembly 904 includes optics necessary to guide radiation from illumination source 902 to reticle stage 906. Reticle stage 906 includes a mask with a pattern that is to be transferred to the semiconductor wafer surface of wafer stage 910 by radiation from illumination source 902. Projection optics 908 includes the optics necessary to guide the radiation transmitted through the mask pattern of a reticle in reticle stage 906 to the semiconductor wafer surface of wafer stage 910. The semiconductor wafer surface of wafer stage 910 is the surface of a semiconductor wafer to be lithographically exposed.

Illumination source 902 produces radiation 912. Radiation 912 is transmitted through source optics assembly 904 (also called illumination optics), reticle stage 906, and projection optics 908, to a semiconductor wafer surface in wafer stage 910. The pattern of the reticle in reticle stage 906 is transferred to the semiconductor wafer surface of wafer stage 910.

In lithography systems, portions or all of source optics assembly 904, reticle stage 906, projection optics 908, and wafer stage 910 are included in an isolation system, including a bridge structure to which some of these components are mounted. The isolation system attempts to minimize motion in the structure supporting these critical components. The present invention relates to a lithography tool isolation system that reduces the relative motion between critical components of a lithography tool, including the source optics, wafer stage, reticle stage, and projection optics.

For example, source optics assembly 904 can include an optical relay. The optical relay can include one or more lenses, and one or more framing blades used to frame and adjust radiation passing through the optical relay. The framing blades can be moved by linear motors to adjust the amount of radiation passing through the optical relay. It is desirable to limit motion loads due to the framing blade movement in other sensitive lithography components. For further detail on exemplary framing blades, refer to U.S. Pat. No. 6,307,619 B1 to Galburt et al., entitled "Scanning Framing Blade Apparatus," which is incorporated by reference in its entirety.

In another example, reticle stage 906 includes components used to move and position the reticle. It is desirable to limit motion loads due to the movement of the reticle in other sensitive lithography components.

In another example, wafer stage 910 includes components used to move and position the semiconductor wafer. It is desirable to limit motion loads due to the movement of the wafer in other sensitive lithography components.

A more detailed description of the critical components of a lithography apparatus, and an example isolation system, are described in the following section.

3. Example Lithography Tool Isolation System Configuration

Figure 1B:
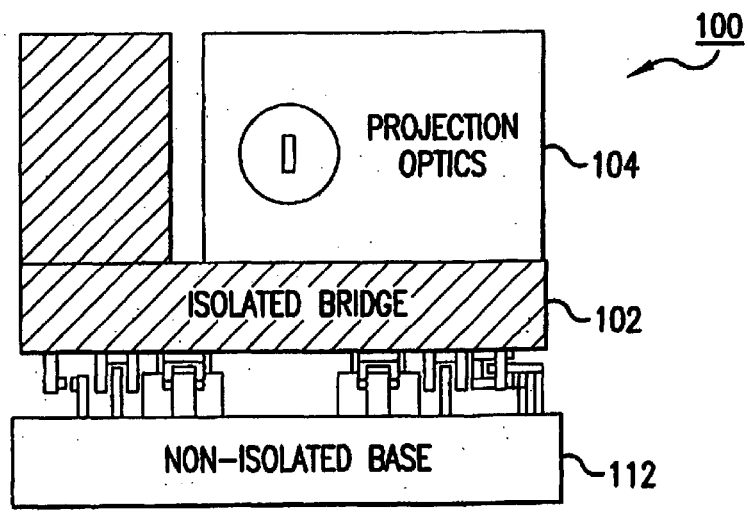

FIGS. 1A and 1B illustrate simplified side and front views of a lithographic tool apparatus 100. Lithographic tool apparatus 100 incorporates an isolation system to minimize motion in the structure supporting critical optical components. Lithographic tool apparatus 100 includes an isolated bridge 102, a projection optics 104, a first, second, and third pneumatic isolator 106, 108, and 110, anon-isolated base frame 112, a first and second relative position sensor 114 and 116, a first, second, third, and fourth actuator 118, 120, 122, and 124, a wafer sub-stage 126, a wafer precision stage 128, a focus back plate 130, one or more flexured spacing rods 132, a reticle stage 134, a linear motor 136, a 1× relay 138, and air bars 140. These elements of lithographic tool apparatus 100 are more fully described in the following text and subsections below.

Figure 2A:
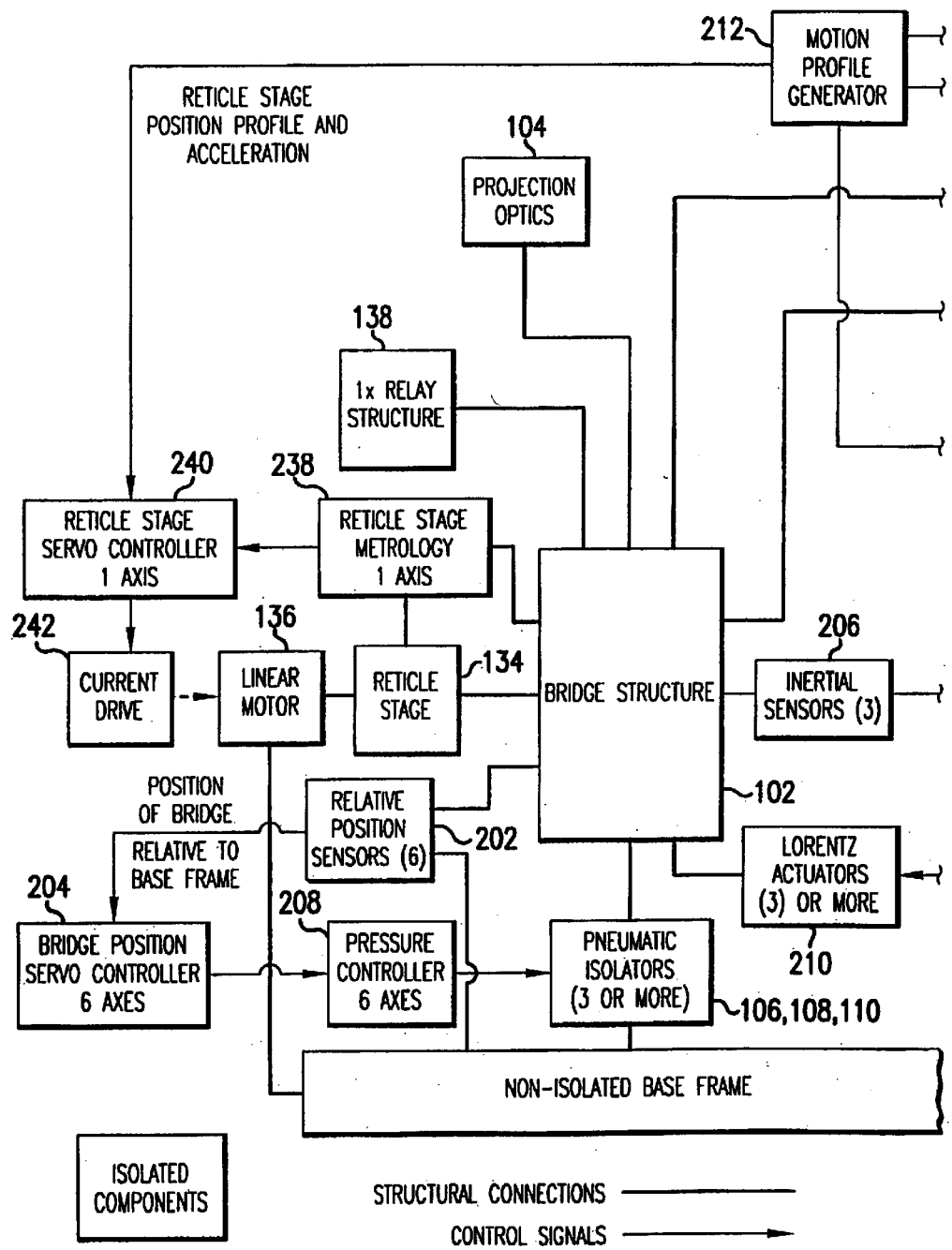
FIGS. 2A and 2B show an exemplary control system block diagram related to the lithographic tool apparatus of FIGS. 1A and 1B, according to an embodiment of the present invention.
Figure 2B:
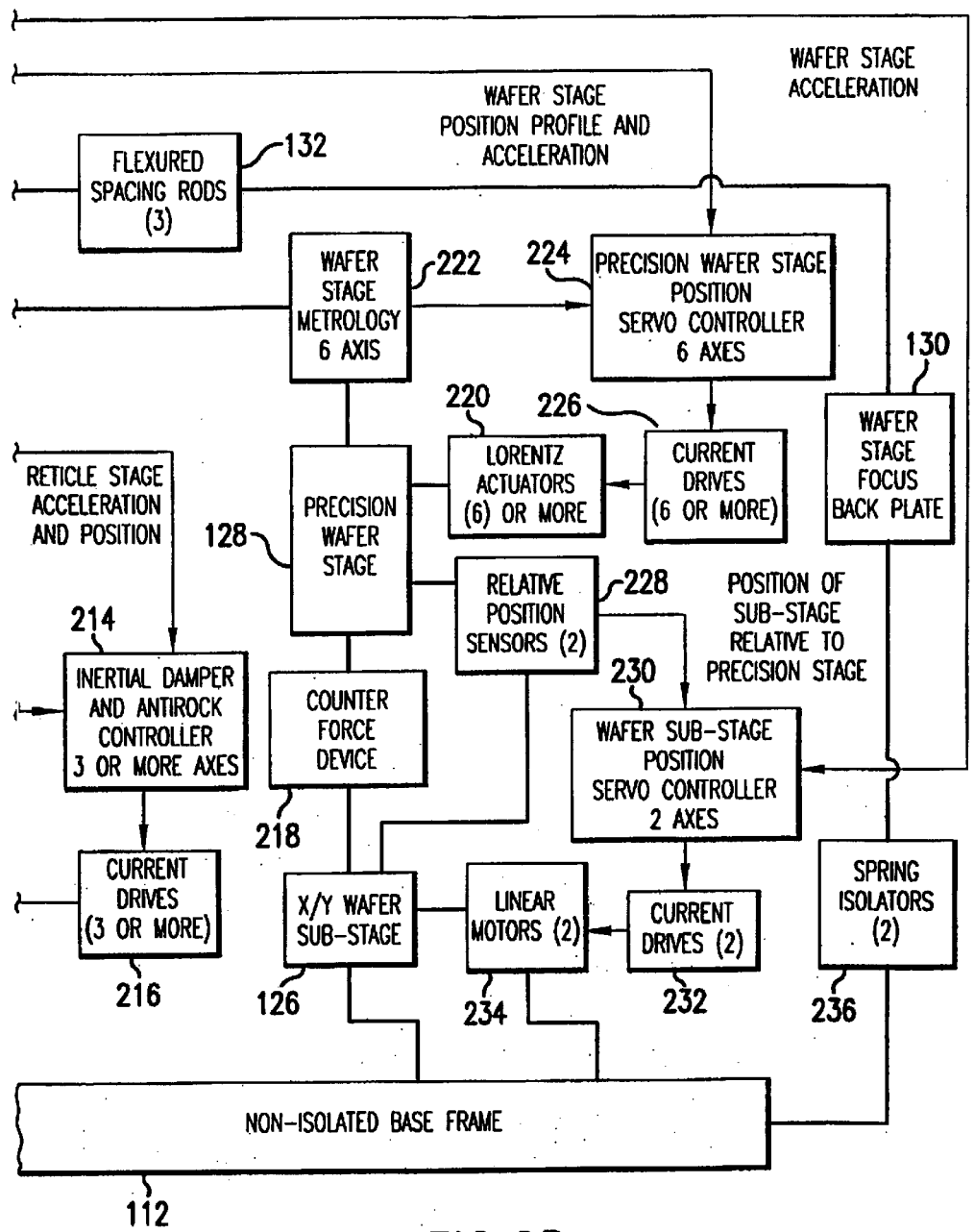

FIGS. 2A and 2B show a control system block diagram related to lithographic tool apparatus 100 of FIGS. 1A and 1B. In FIGS. 2A and 2B, connecting lines between system blocks indicate structural connections, and arrows indicate control and/or data signals.

The isolation system of FIGS. 1A, 1B, 2A, and 2B includes a structure referred to as isolated bridge 102. Isolated bridge 102 supports projection optics and metrology components associated with wafer and reticle stage systems. As shown in FIGS. 1A and 1B isolated bridge 102 supports projection optics 104. Projection optics 104 includes optics necessary to guide radiation transmitted through a mask pattern of a reticle in reticle stage 134 to a semiconductor wafer surface attached to wafer precision stage 128. Projection optics 104 is substantially the same as projection optics 908 of FIG. 9.

Metrology components supported by isolated bridge 102 include devices used to measure and track the position of components of reticle stage 906 and wafer stage 910, for example. These devices can include laser gauges used in conjunction with interferometer mirrors, and capacitance gauges, that accurately ascertain the position or distance of wafer precision stage 128 from isolated bridge 102, for example. These devices can also include relative position sensors used to detect the relative position between wafer precision stage 128 and isolated bridge 102. Other metrology devices are applicable to the present invention.

Isolated bridge 102 also supports reticle stage 134. The position of reticle stage 134 is guided by air bars 140 (not shown in FIGS. 2A and 2B), and is driven by linear motor 136. Reticle stage 134 includes the reticle that has a mask pattern that is transferred to the semiconductor wafer surface attached to wafer precision stage 128. The configuration and operation of reticle stage 134 is further described below. In reference to lithography system 900 shown in FIG. 9, reticle stage 906 includes reticle stage 134, air bars 140, and linear motor 136.

Isolated bridge 102 also supports 1× relay 138. 1× relay 138 is an optical relay. In reference to lithography system 900 shown in FIG. 9, 1× relay 138 includes at least one of the final lenses of source optics assembly 904, and includes corresponding framing blades used to frame and adjust radiation passing through 1× relay 138. 1× relay 138 transmits and controls where illumination from illumination source 902 of FIG. 9 meets the reticle of reticle stage 134. 1× relay 138 has a magnification of one, but can have other magnification factors.

Non-isolated base frame 112 supports wafer sub-stage 126. Wafer sub-stage 126 supports wafer precision stage 128 with a bracket 142 (not shown in FIGS. 2A and 2B). A semiconductor wafer is attached to wafer precision stage 128 for exposure by illumination source 902 of FIG. 9. Focus back plate 130 is attached to isolated bridge 102 by flexured spacing rods 132. The configuration and operation of these components is further described below. In reference to wafer stage 910 of FIG. 9 includes wafer sub-stage 126, wafer precision stage 123, focus back plate 130, and flexured spacing rods 132.

Figure 3C:
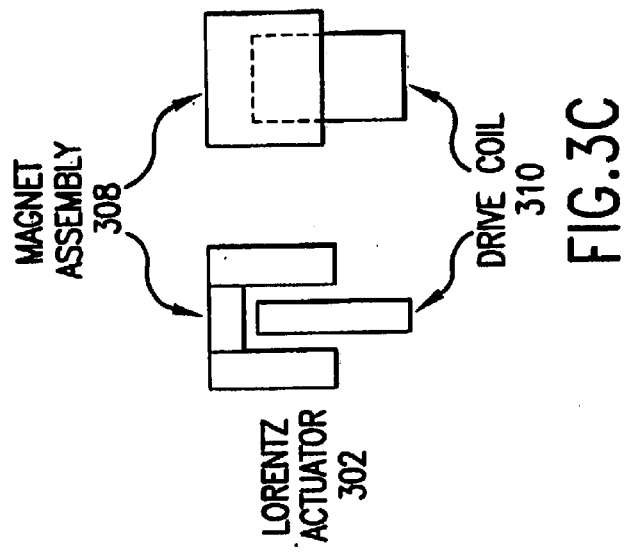
FIG. 3C illustrates two views of an exemplary Lorentz actuator.
Figure 3B:
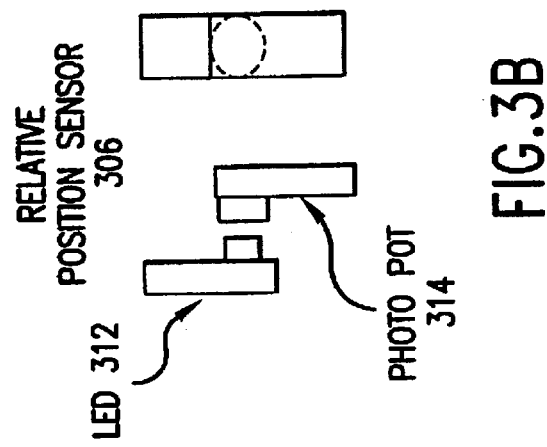
FIG. 3B illustrates two views of an exemplary relative position sensor.
Figure 3A:
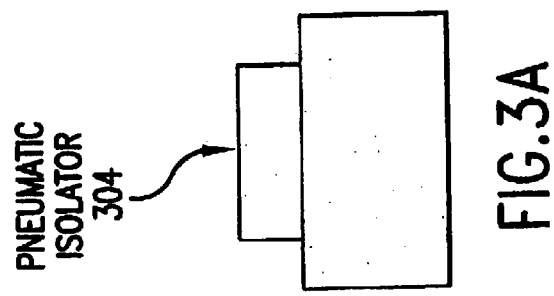
FIG. 3A illustrates an exemplary pneumatic isolator.

Isolated bridge 102 is generally kept isolated from outside contact by various supports and controls. The weight of isolated bridge 102 can be supported by one or more soft pneumatic isolators. (FIG. 3A illustrates an exemplary pneumatic isolator 304.) FIG. 1A shows first, second, and third pneumatic isolators 106, 108, and 110 that are used to support isolated bridge 102. First, second, and third pneumatic isolators 106, 108, and 110 are mounted on a non-isolated tool structure referred to as a non-isolated base frame 112. The structure and operation of pneumatic isolators are described more fully below.

The position of isolated bridge 102 is servo controlled using feedback from one or more relative position sensors to remain stationary relative to non-isolated base frame 112 at low frequencies (for example, frequencies less than 1 Hz). FIG. 1A shows first and second relative position sensors 114 and 116 used to detect the position of isolated bridge 102. Relative position sensors 114 and 116 can be non-contact optical sensors, for example. (FIG. 3B illustrates side and front views of an exemplary relative position sensor 306 that can be used for sensors 114 and 116.) The structure and operation of relative position sensors are described more fully below.

A system for servo control of isolated bridge 102 is illustrated in FIG. 2A. First and second relative position sensors 114 and 116 are included in a relative position sensors 202. Relative position sensors 202 track and/or measure the relative position of isolated bridge 102 to non-isolated base frame 112. Relative position sensors 202 output a relative position signal to a bridge position servo controller 204. Bridge position servo controller 204 outputs a control signal to a pressure controller 208. Pressure controller 208 outputs a pressure signal to first, second, and third pneumatic isolators 106, 108, and 110. First, second, and third pneumatic isolators 106, 108, and 110 support and adjust the position of isolated bridge 102 relative to non-isolated base frame 112, accordingly.

As shown in FIG. 2A, in an embodiment, relative position sensors 202 can include six single-axis relative position sensors 306. The six relative position sensors 306 permit accurate measurement of the three translation degrees of freedom, and the rotational degrees of freedom. Alternatively, three dual-axis relative position sensors 306 can be used for relative position sensors 202. Bridge position servo controller 204 receives the six-axis relative position signal from relative position sensors 202, and outputs a six-axis control signal to pressure controller 208. Six-axis servo controllers, such as bridge position servo controller 204, are further described below. Pressure controller 208 outputs a six-axis pressure control signal to pneumatic isolators 106, 108, 110, which support and adjust the position of isolated bridge 102 in all six axes, as described above. In alternative embodiments, control in fewer degrees of freedom may be required, and hence, fewer relative position sensors may be necessary.

One or more non-contact magnetic force actuators are mounted between non-isolated base frame 112 and isolated bridge 102. FIG. 1A shows first, second, third, and fourth actuators 118, 120, 122, and 124. (For example, first, second, third, and fourth actuators 118, 120, 122, and 124 can be Lorentz actuators, as shown in FIG. 3C, which illustrates side and front views of an exemplary Lorentz actuator 302. The structure and operation of Lorentz actuator 302 is described more fully below.) First, second, third, and fourth actuators 118, 120, 122, and 124 augment the pneumatic forces described above with respect to first, second, and third pneumatic isolators 106, 108, and 110. Actuators also enable servos related to isolated bridge 102 to have a quick response in 6 degrees of freedom. The actuators can also be used to cancel dynamic loads due to the combination of gravity and horizontal reticle stage motion. This process, referred to as "anti-rock" compensation, involves predicting acceleration, and gravity loads associated with the stage motion profiles, and canceling these loads using the magnetic force actuators of the isolation system.

A system for actuator control of isolated bridge 102 is shown in FIGS. 2A and 2B. First, second, third, and fourth non-contact magnetic force actuators 118, 120, 122, and 124 are included in an actuators 210. A motion profile generator 212 provides for anti-rock compensation, by predicting acceleration and gravity loads as described above. Motion profile generator 212 outputs a motion profile signal to inertial damper and antirock controller 214. Antirock controller 214 outputs a motion control signal to a current drives 216. Current drive 216 outputs current drive signals to actuators 210. Actuators 210 support and control the position of isolated bridge 102, accordingly.

At higher frequencies, the position of isolated bridge 102 can be stabilized by feedback from one or more inertial sensors 206, as shown in FIGS. 2A and 2B. Inertial sensors 206 are coupled to isolated bridge 102. Inertial sensors 206 output an inertial sensor signal to inertial damper and antirock controller 214. Antirock controller 214 accounts for the inertial sensor signal in its output motion control signal, and the position of isolated bridge 102 is adjusted accordingly by actuators 210.

In general, the isolation system of lithographic tool apparatus 100 should have sufficient clearance to allow for worst case ground displacements and worst case mechanical tolerances. Further details of lithographic tool apparatus 100 are provided in the following subsections.

3.1 Example Wafer Stage Configuration

Lithography tools may incorporate a wafer stage, such as represented by wafer stage 910 in FIG. 9, to control the motion of the wafer during the lithographic process. For example, the wafer stage can incorporate a sub-stage with a large X and Y (mutually orthogonal axes in the plane of the wafer) travel. FIG. 1A illustrates a wafer sub-stage 126 with a large X/Y travel, in lithographic tool apparatus 100. Wafer sub-stage 126 is mounted on non-isolated base frame 112. Wafer sub-stage 126 supports a six degree of freedom, levitated wafer precision stage 128. The wafer is attached to wafer precision stage 128 by suction, for instance.

As shown in FIG. 2B, the position and movement of wafer precision stage 128 can be driven by wafer precision stage actuators 220. Wafer precision stage actuators 220 can be any applicable actuators described herein or elsewhere, including one or more Lorentz actuators 302, shown in FIG. 3C. The weight of wafer precision stage 128 can be supported by a counter force device 218, such as a soft spring. Laser gages, and capacitance gages, and other relative position sensors, including one or more of relative position sensors 306, can be used to provide position feedback for wafer precision stage 128. The position of wafer precision stage 128 should be tightly controlled. For example, in some applications, the position of wafer precision stage 128 is controlled to a 10 nanometer (nm) accuracy.

A system for actuator control of wafer precision stage 128 is shown in FIGS. 2A and 2B. A wafer stage metrology 222 is coupled between wafer precision stage 128 and isolated bridge 102. Wafer stage metrology 222 provides position feedback to servos for wafer precision stage 128. Wafer stage metrology 222 outputs a wafer stage position signal to a wafer precision stage position servo controller 224. Wafer precision stage position servo controller 224 outputs a wafer precision stage control signal to current drives 226. Current drives 226 output current drive signals to actuators 220. Actuators 220 support and control the position of wafer precision stage 128, accordingly.

Motion profile generator 212 can provide an antirock compensation signal, as described above, to wafer precision stage position servo controller 224. Wafer precision stage position servo controller 224 accounts for the antirock compensation signal in its output wafer precision stage control signal, and the position of wafer precision stage 128 is adjusted accordingly.

Wafer sub-stage 126 can be servo controlled to follow movement of wafer precision stage 128. For example, wafer sub-stage 126 can be servo controlled to follow movement of wafer precision stage 128 to a 50 micron accuracy.

A system for control of the position of wafer sub-stage 128 is illustrated in FIGS. 2A and 2B. Relative position sensors 228 track or measure the relative position of wafer sub-stage 126 to wafer precision stage 128. Relative position sensors 228 output a relative position signal to a wafer sub-stage position servo controller 230. Wafer sub-stage position servo controller 230 outputs a control signal to a current drives 232. Current drives 232 outputs current drive signals to a linear motors 234. Linear motors 234 adjust the position of wafer sub-stage 126 relative to wafer precision stage 128, accordingly.

Motion profile generator 212 can provide an antirock compensation signal, as described above, to wafer sub-stage position servo controller 230. Wafer sub-stage position servo controller 230 accounts for the antirock compensation signal in its output wafer precision stage control signal, and the position of wafer sub-stage 128 is adjusted accordingly.

A focus back plate 130 with an optically flat surface is mounted to wafer precision stage 128. Focus back plate 130 is attached to isolated bridge 102 by flexured spacing rods 132. The weight of focus back plate 130 can be supported by a counter force device, such as spring isolators 236 or the like, shown in FIG. 2B.

Focus back plate 130 performs at least two functions. First, focus back plate 132 is a metrology reference. For example, wafer precision stage 128 can include one or more non-contact capacitance gages that measure a distance to focus back plate 132, thus providing feedback for Z, Tx, and Ty servos of wafer precision stage 128. Second, wafer precision stage 128 can include focus travel stops that are attached to vacuum loaded air bearings running on the surface of focus back plate 132. The operating clearance associated with the isolation system of isolated bridge 102 can cause a wafer stage designer to incorporate similar clearance between the non-isolated wafer sub-stage 126 and the levitated wafer precision stage 128. Without focus travel stops, the wafer could crash into wafer surface focus gauges that are mounted on projection optics 104.

In general, most loads associated with the wafer stage motion appear on non-isolated base frame 112, and minimal loads associated with focus stop motion are coupled to focus back plate 130 and isolated bridge 102.

For further detail on an exemplary wafer stage, refer to U.S. Pat. No. 5,285,142, entitled "Wafer Stage with Reference Surface," which is incorporated by reference in its entirety.

3.2 Example Reticle Stage Configuration

Lithography tools can incorporate a reticle stage, such as represented by reticle stage 906 of FIG. 9, to support and control the motion of the reticle during the lithographic process. FIG. 1A shows a reticle stage 134 in lithographic apparatus 100. Typically, reticle stage 134 has a single motion axis and is mounted on isolated bridge 102. Reticle stage 134 can be guided by air bearings, shown as air bars 140, and can be driven by a linear motor 136. A stationary component of linear motor 136 is mounted on the non-isolated base frame 112. Thus, a primary reaction load due to acceleration of reticle stage 134 appears on non-isolated base frame 112. Moments due to the combination of gravity and motion of reticle stage 134 can appear on isolated bridge 102. Also, if the center of gravity of reticle stage 134 is offset from the drive axis of linear motor 136, a moment due to acceleration can also appear on the isolated bridge 102. The position of reticle stage 134 can be servo controlled relative to isolated bridge 102 using feedback from laser gages.

A system for control of the position of reticle stage 134 is illustrated in FIG. 2A. Reticle stage metrology 238 provides position feedback to servos for reticle stage 134 relative to isolated bridge 102. Reticle stage metrology 238 outputs a reticle stage position signal to a reticle stage servo controller 240. Reticle stage servo controller 240 outputs a reticle stage control signal to a current drive 242. Current drive 242 outputs a current drive signal to linear motor 136. Linear motor 136 adjusts the position of reticle stage 134, accordingly.

Motion profile generator 212 can provide an antirock compensation signal, as described above, to reticle stage servo controller 240. Reticle stage servo controller 240 accounts for the antirock compensation signal in its output reticle stage control signal, and the position of reticle stage 134 is adjusted accordingly.

3.3 Non-contact Magnetic Force Actuators

Non-contact magnetic force actuators are useful for high performance isolation systems, and are particularly useful in magnetically levitated stages. Magnetic force actuators are typically "Lorentz force" devices. An example Lorentz actuator 302 is shown in FIG. 3C. FIG. 3C shows a side view of Lorentz actuator 302 on the left, and a front view on the right. Lorentz actuator 302 includes a permanent magnet assembly 308 and a drive coil 310. Magnet assembly 308 generates a strong magnetic field that loops though the independently mounted drive coil 310. When a control current is passed though drive coil 310, the interaction between the current and the magnetic field generates a "Lorentz force" on drive coil 310 at right angles to the current flow and magnetic field lines. The force in drive coil 310 is proportional to the current, and an equal but opposite reaction force appears on permanent magnet assembly 308. If permanent magnet assembly 308 generates a uniform magnetic field over the volume of drive coil 310, then the force produced by Lorentz actuator 302 is independent of the position of drive coil 310 within magnetic assembly 308.

When used in an active positioning servo, Lorentz force actuators allow the position of a structure to be actively controlled without coupling vibration to the controlled structure. Alternative types of magnetic actuators, such as electro-magnets, can be used in place of Lorentz actuators. Because the force produced by electromagnets is typically highly gap dependent, compensating for this non-linearity can add complexity to a control servo.

In a typical configuration, six actuators can be used to position a structure such as isolated bridge 102, with three actuators arranged in a vertical orientation, two arranged in a first horizontal orientation and one arranged in a second horizontal orientation. This configuration and alternative configurations are applicable to the present invention. Actuator arrangements where one actuator force is nearly in-line with another is generally undesirable.

3.4 Non-contact Relative Position Sensors

A number of different technologies have been used to measure the absolute displacement between two objects without physical contact. For instance, a combination of infrared light emitting diodes and photo-diodes can be used to detect motions. For example, such a combination can be used to detect motions on the order of +/−1 mm. If the photo detector is a quad cell or a two-dimensional photo pot, a single sensor can measure two axes at once.

FIG. 3B shows two views of a relative position sensor 306, that includes a light emitting diode (LED) 312 and a photo pot 314. Capacitance and eddy current gages can also be used, as well as linear variable differential transformers (LVDTs). For longer distances, optical encoders, either absolute or incremental, can be used. For high accuracy measurement over extended ranges, laser gage interferometers can be used.

In a typical configuration, three dual-axis sensors are located in a pattern that permits accurate measure of the three translation degrees of freedom, and the rotational degrees of freedom. This configuration and alternative configurations are applicable to the present invention. Sensor arrangements where one linear measurement is nearly in-line with another are generally undesirable.

3.5 Pneumatic Isolators, and Counter Force Devices

A variety of devices are available for supporting and isolating structures such as isolated bridge 102. For example, rolling diaphragm pneumatic isolators can be used to counter-force the weight of stationary isolated structures. As discussed above, FIG. 3A shows an exemplary pneumatic isolator 304. Damped pendulum supports can be used to provide horizontal isolation. Rubber bearings can also be used as a counter force device.

Counter force devices 218 used with wafer precision stage 128 can include gas lubricated air cylinders, with inverted flexure rods or air pads used for horizontal isolation. A large air tank, and a precision pressure regulator coupled as directly as possible to the air cylinder can be used to improve isolation characteristics. Stage counter-force cylinder design can be scaled upward to support a large static structure. While passive isolation systems require isolators that are well damped, an active isolation system can utilize highly under-damped isolators. Lower isolator damping improves high isolation at high frequencies.

In a typical configuration, three or four isolators can be placed around the center of gravity of the supported structure. This configuration and alternative configurations are applicable to the present invention.

3.6 Mechanical Properties of an Isolated Structure

It is desirable for an isolated structure, such as isolated bridge 102, to have a first non-rigid body mode much higher than the highest rigid body mode. It is also desirable that the lowest non-rigid body modes be well damped to minimize resonance amplification. In general, high rigidity reduces motion between isolated components. Also, in general, high resonant frequencies allow for higher active control bandwidths, which result in improved performance.

3.7 Six-Axis Position Control Servos

Six-axis servos can be used to actively control the position of rigid structures. In general, a control system processes digital motion data received from feedback sensors into an orthogonal set of three translation axes and three rotation axes. For instance, inertial damper and antirock controller 214 and bridge position servo controller 204 are such control systems. The transformed feedback data is subtracted from a set of six commanded positions, or motion profiles. The resulting position errors can be fed through appropriate frequency compensation algorithms to create servo drive signals. These servo drive signals can be processed through mass and actuator drive matrixes, and fed to digital-to-analog converters. The resulting analog actuator drive signals, also referred to as control signals, can be fed to current output power amplifiers, such as current drives 216 shown in FIG. 2B, that drive the Lorentz actuator coils. Anti-rock compensation signals can be summed with the digital actuator drive signals. The anti-rock signals are computed based upon factors such as planned motion profiles, stage mass properties, and stage configuration. For instance, motion profile generator 212 outputs anti-rock compensation signals. The servos also can generate low frequency corrections to the pneumatic counter force devices that support the static weight of the controlled structures. For example, bridge position servo controller 204 generates such a signal to provide an adjustment for pneumatic isolators 106, 108, and 110.

4. Advanced Lithography Tool with Dual Isolation System Embodiments of the Present Invention Structural implementations for the dual isolation system configuration of the present invention are described at a high-level and at a more detailed level. These structural implementations are described herein for illustrative purposes, and are not limiting. In particular, the present invention as described herein can be achieved using any number of structural implementations. For instance, the present invention as described herein can be implemented in any lithography system requiring a high degree of isolation from outside vibration, and a reduction in relative motion of lithography system components. For example, in embodiments, the present invention can be implemented in a Micrascan and other advanced lithography tool platforms developed by the Lithography Group of Silicon Valley Group, Inc., located in Wilton, Conn.

The present invention provides for a lithography tool with a dual isolation system. Unlike conventional systems, the present invention includes two separate active isolated structural assemblies: an isolated bridge and an isolated base frame. In embodiments, both isolated structures are positioned in six degrees of freedom by magnetic force actuators. The weight of the isolated structures can be counter-forced by one or more soft pneumatic isolators, mechanical springs, and/or other counter-force devices.

Figure 4:
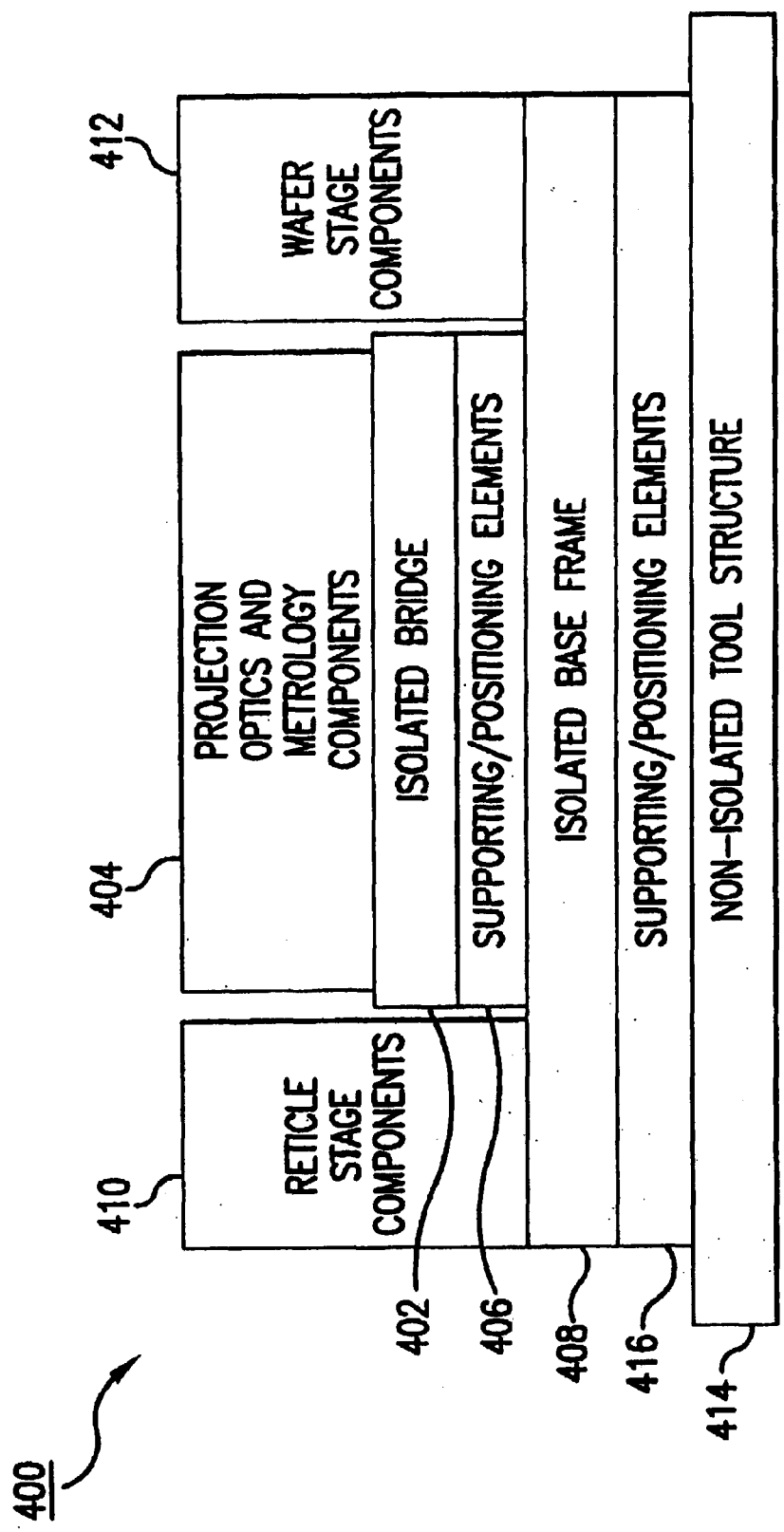
FIG. 4 illustrates an exemplary structural block diagram of a lithography tool with dual isolation system, according to an embodiment of the present invention.

FIG. 4 illustrates a structural block diagram of a dual isolation system lithography tool 400, according to an exemplary embodiment of the present invention. Lithography tool 400 includes an isolated bridge 402, projection optics and metrology components 404, first supporting/positioning elements 406, an isolated base frame 408, reticle stage components 410, wafer stage components 412, and second supporting/positioning elements 416. These components are first described at a high level, followed by a more detailed description in relation to a preferred embodiment. Lithography tool 400 is mounted to a non-isolated tool structure 414.

The first isolated structure, isolated bridge 402, is structurally similar to isolated bridge 102. Isolated bridge 402 supports projection optics and passive metrology components 404. Isolated bridge 402 is coupled to the second isolated structure, isolated base frame 408, through first supporting/positioning elements 406.

Projection optics and passive metrology components 404 includes projection optics and components related to metrology. For instance, projection optics and passive metrology components 404 can include projection optics substantially similar or identical to those of projection optics 104, and can include metrology components as described herein.

First supporting/positioning elements 406 includes one or more counter-force devices for supporting isolated bridge 402 with respect to isolated base frame 408, as are described elsewhere herein. The weight of isolated bridge 402 can be counter-forced by one or more pneumatic isolators, mechanical springs, and/or other counter-force devices. In a preferred embodiment, first supporting/positioning elements 406 includes porous gas bearing lubricated air cylinders and inverted pendulum support rods. First supporting/positioning elements 406 can include a positioning element, such as one or more actuators, and other such elements described elsewhere herein. First supporting/positioning elements 406 can also include one or more position detectors as described elsewhere herein.

The second isolated structure, isolated base frame 408, supports active components of the reticle and wafer stages, reticle stage components 410 and wafer stage components 412, respectively. These active components are described more fully below. Isolated base frame 408, is preferably a metal bridge constructed in a similar fashion as isolated bridge 102. Isolated base frame 408 preferably handles all motion related loads. In addition, in a preferred embodiment, a control system for isolated base frame 408 includes the above-described anti-rock feature to transfers motion related loads to a non-isolated tool structure 414. Thus, relative motion between isolated bridge 402 and isolated base frame 408 are minimized. This configuration provides for a novel method of reaction load control.

Second supporting/positioning elements 416 includes one or more counter-force devices for supporting isolated base frame 408 with respect to non-isolated tool structure 414. For example, the weight of isolated base frame 408 can be counter-forced by one or more soft pneumatic isolators or mechanical springs, and/or other counter-force devices described elsewhere herein. First supporting/positioning elements 406 can include a positioning element, such as one or more actuators, and other such elements described elsewhere herein. First supporting/positioning elements 406 can also include one or more position detectors as described elsewhere herein.

Non-isolated tool structure 414 can be any surface or special purpose structure applicable to mounting and supporting a lithography tool apparatus as described herein, such as those currently used in the art.

Figure 5A:
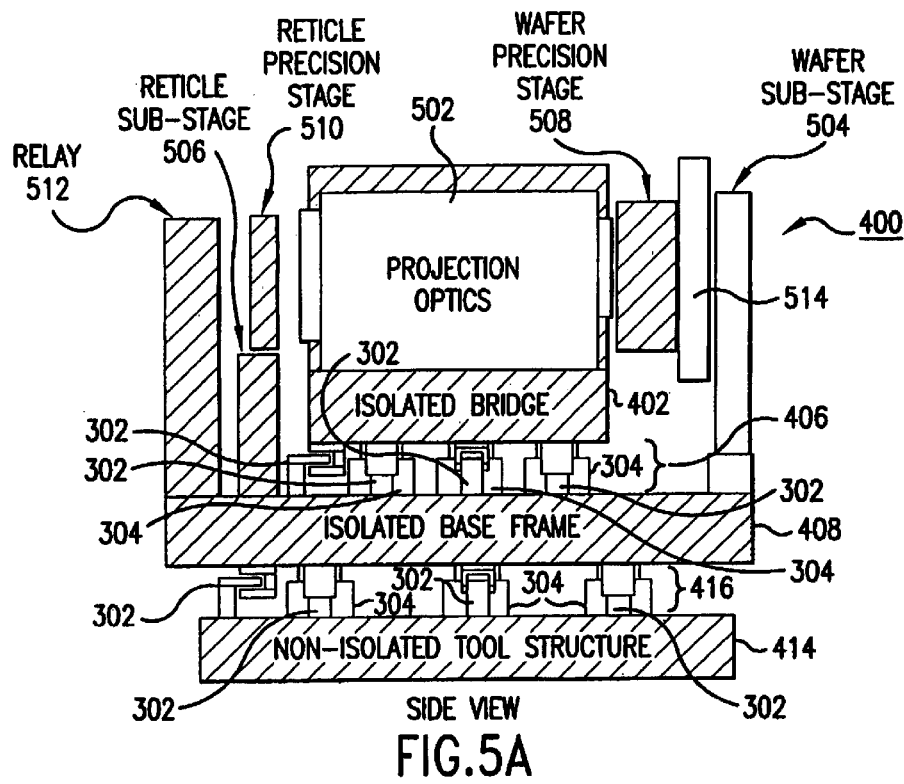
FIGS. 5A and 5B respectively illustrate side and front views of a lithographic tool apparatus, according to an embodiment of the present invention.
Figure 5B:
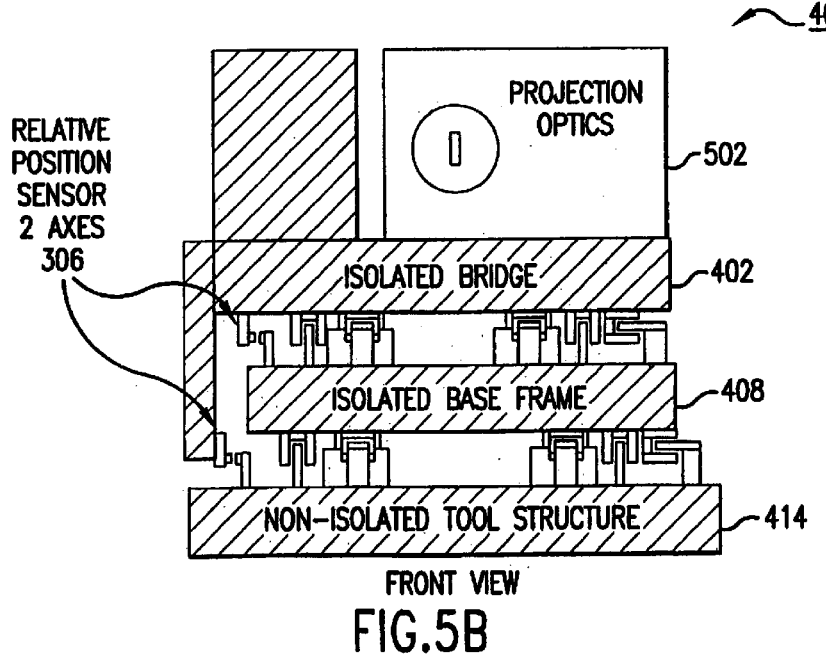

FIGS. 5A and 5B respectively illustrate side and front views of dual isolation system lithography tool 400, according to a preferred embodiment of the present invention. Lithography tool 400 includes isolated bridge 402, first supporting/positioning elements 406, isolated base frame 408, second supporting/positioning elements 416, a projection optics 502, a wafer sub-stage 504, a reticle sub-stage 506, a wafer precision stage 508, a reticle precision stage 510, and a relay 512. These elements of lithographic tool apparatus 400 are more fully described in the following text.

Figure 6A:
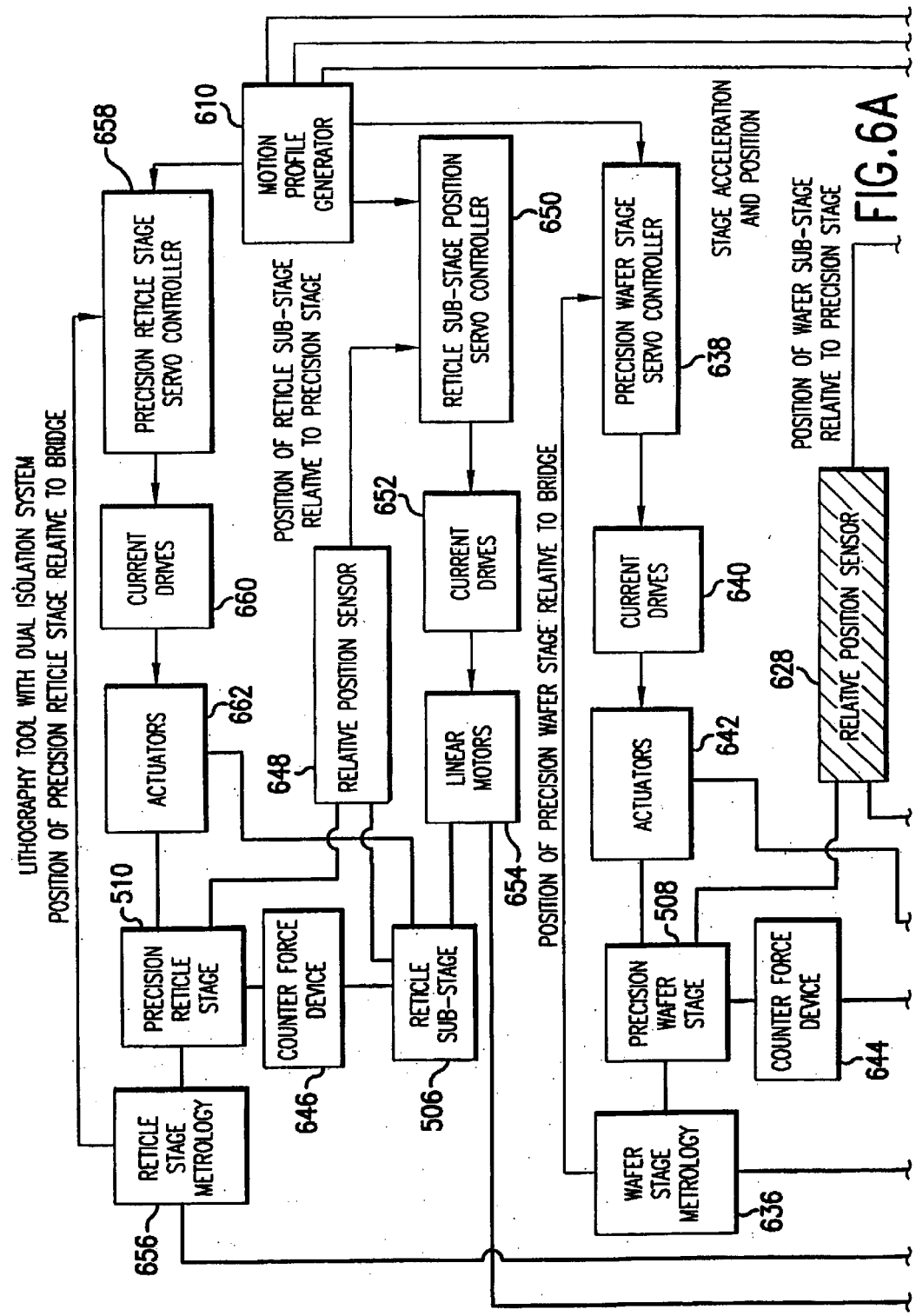
FIGS. 6A and 6B show an exemplary control system block diagram related to the lithographic tool apparatus of FIGS. 5A and 5B, according to an embodiment of the present invention.
Figure 6B:
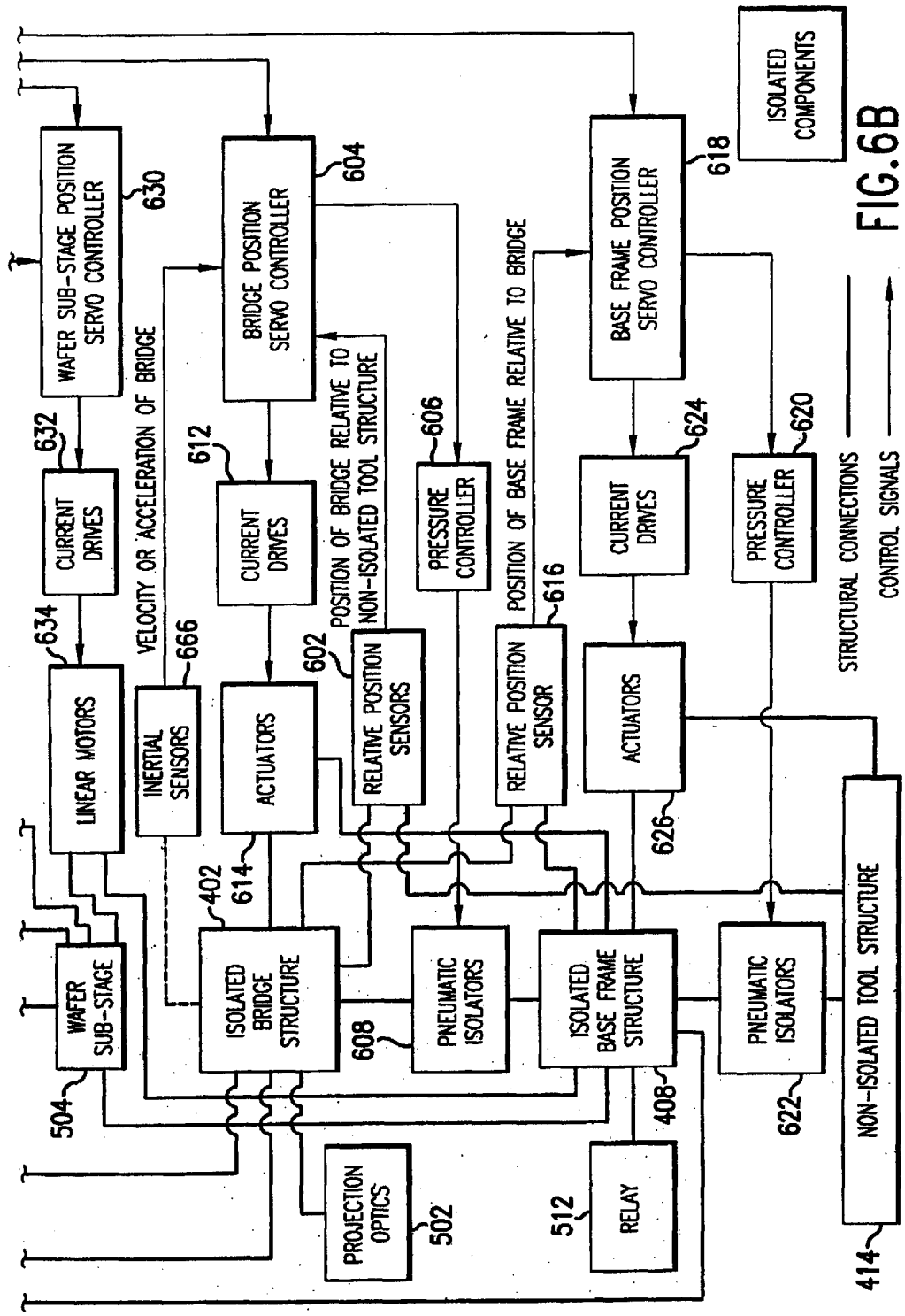

FIGS. 6A and 6B show an exemplary control system block diagram related to lithography tool with dual isolation system 400, according to an embodiment of the present invention. In FIGS. 6A and 6B, connecting lines between system blocks indicate structural connections, and arrows indicate control and/or data signals.

Isolated bridge 402 supports projection optics and metrology components associated with wafer and reticle stage systems. As shown in FIGS. 5A and 5B, isolated bridge 402 supports projection optics 502. Projection optics 502 includes optics necessary to guide radiation transmitted through a mask pattern of a reticle in reticle precision stage 510 to a semiconductor wafer surface in wafer precision stage 508. For instance, projection optics 502 is substantially similar to projection optics 104 of FIGS. 1A and 1B.

Metrology components supported by isolated bridge 402 include devices related to measuring and tracking the position of components of reticle stage components 410 and wafer stage components 412, shown in FIG. 4. These metrology devices can include laser gauges used in conjunction with interferometer mirrors, and can include capacitance gauges, that accurately ascertain the position or distance of wafer precision stage 508 or reticle precision stage 510 from isolated bridge 402, for example. These devices can also include relative position sensors used to detect the relative position between a precision stage and isolated bridge 402. Other metrology devices are applicable to the present invention.

Isolated base frame 408 supports isolated bridge 402 via first supporting/positioning elements 406. A first, second, and third pneumatic isolator 304 are shown mounted on isolated base frame 408 in FIG. 5A. The pneumatic isolators support a majority of the weight of isolated bridge 402. In alternative embodiments, first supporting/positioning elements 406 includes additional or fewer pneumatic isolators. Mounting springs can be used to support isolated bridge 402 on isolated base frame 408. Such mounting springs significantly improve the degree to which isolated bridge 402 is isolated from higher frequency ground vibration.

As shown in FIG. 5B, one or more relative position sensors 306 detect the position of isolated bridge 402 relative to non-isolated tool structure 414, and one or more relative position sensors 306 detect the position of isolated base frame 408 relative to isolated bridge 402. The "static" portion of relative position sensors 306 that monitor the position of isolated bridge 402 are mounted to non-isolated tool structure 414, while the "static" portion of relative position sensors 306 that monitor the position of isolated base frame 408 are mounted on the structure of isolated bridge 402. While this arrangement can appear counter-intuitive, it is the preferred configuration. In an embodiment, six relative position sensors 306 are coupled between isolated bridge 402 and non-isolated tool structure 414, and six relative position sensors 306 are coupled between isolated bridge 402 and isolated base frame 408. The invention is also applicable to other quantities and mounting points for relative position sensors 306.

A system for the support and position control of isolated bridge 402 is illustrated in FIGS. 6A and 6B. Relative position sensors 602 track or measure the relative position of isolated bridge 402 to non-isolated tool structure 414. Relative position sensors 602 include six, or other applicable number of relative position sensors 306. Relative position sensors 602 output a relative position signal to a bridge position servo controller 604. Bridge position servo controller 604 outputs a control signal to a pressure controller 606. For example, bridge position servo controller 604 provides servo control in six axes, or other applicable number of axes. Pressure controller 606 outputs a pressure signal to a pneumatic isolators 608. Pneumatic isolators 608 comprises three, or other applicable number of pneumatic isolators 304, for example. Pneumatic isolators 608 support and adjust the position of isolated bridge 402 relative to non-isolated tool structure 414.

In the embodiment shown in FIGS. 5A and 5B, one or more Lorentz actuators 302 in first supporting/positioning elements 406 control the position of isolated bridge 402 relative to isolated base frame 408. In an embodiment, the magnet assemblies 308 of the Lorentz actuators 302 are attached to isolated bridge 402, and the corresponding drive coils 310 are attached to isolated base frame 408. Mounting the reaction portion of the force actuators for isolated bridge 402 on isolated base frame 408 allows for smaller actuator air gaps, and a more modular design. In an embodiment, six Lorentz actuators 302 are used. More or less actuators can be used without departing from the spirit and scope of the present invention.

A system for actuator control of isolated bridge 402 is shown in FIGS. 6A and 6B. A motion profile generator 610 provides for anti-rock compensation, by predicting acceleration and gravity loads as described above. Motion profile generator 610 outputs a motion profile signal to bridge position servo controller 604. Bridge position servo controller 604 outputs a position control signal to a current drives 612. Current drives 612 outputs current drive signals to an actuators 614. Actuators 614 includes six, or other applicable number of Lorentz actuators 302, for example. Actuators 614 support and control the position of isolated bridge 402.

At higher frequencies, the position of isolated bridge 102 can be stabilized by feedback from one or more inertial sensors 666. Inertial sensors 666 are coupled to isolated bridge 402. Inertial sensors 666 output an inertial sensor signal to bridge position servo controller 604. Bridge position servo controller 604 accounts for the inertial sensor signal in its output position control signal, and the position of isolated bridge 402 is adjusted accordingly by actuators 614.

One or more pneumatic isolators 304 in second supporting/positioning elements 416 support the weight of isolated base frame 408 in a similar fashion to those supporting the weight of isolated bridge 402. These pneumatic isolators 304 are mounted on non-isolated tool structure 414. Mounting springs can also support isolated base frame 408 on non-isolated tool structure 414. In a preferred embodiment, three pneumatic isolators 304 are used, but the invention is applicable to other numbers.

A system for the position control of isolated base frame 408 is also illustrated in FIGS. 6A and 6B. Relative position sensors 616 track and/or measure the relative position of isolated base frame 408 to isolated bridge 402. Relative position sensors 616 include six, or other applicable number of relative position sensors 306. Relative position sensors 616 output a relative position signal to a base frame position servo controller 618. Base frame position servo controller 618 outputs a control signal to a pressure controller 620. Pressure controller 620 outputs a pressure signal to a pneumatic isolators 622. Pneumatic isolators 622 comprises three, or other applicable number of pneumatic isolators 304, for example. Pneumatic isolators 622 support and adjust the position of isolated base frame 408.

One or more Lorentz actuators 302 in second supporting/positioning elements 416 control the position of isolated base frame 408 relative to non-isolated tool structure 414, in a similar fashion to those controlling the position of isolated bridge 402 relative to isolated base frame 408. In a preferred embodiment, isolated base frame 408 is servo controlled to closely follow the position of isolated bridge 402. In a preferred embodiment, six Lorentz actuators 302 are used, but the invention is applicable to other numbers.

A system for actuator control of isolated base frame 408 is shown in FIGS. 6A and 6B. Motion profile generator 610 provides for anti-rock compensation, by predicting acceleration and gravity loads as described above. Motion profile generator 610 outputs a motion profile signal to base frame position servo controller 618. Base frame position servo controller 618 outputs a position control signal to a current drives 624. For example, base frame position servo controller 618 provides servo control in six axes, or other applicable number of axes. Current drives 624 outputs current drive signals to an actuators 626. Actuators 626 includes six, or other applicable number of Lorentz actuators 302, for example. Actuators 626 support and control the position of isolated base frame 408.

In a novel aspect of the present invention, both the wafer and reticle stage systems incorporate precision stages. Reticle stage components 410 of FIG. 4 includes reticle sub-stage 506 and reticle precision stage 510 of FIG. 5A. Isolated base frame 408 supports reticle sub-stage 506. Reticle sub-stage 506 supports reticle precision stage 510. Reticle precision stage 510 includes the reticle that has a mask pattern used to etch the semiconductor wafer surface attached to wafer precision stage 508.

Wafer stage components 412 of FIG. 4 includes wafer sub-stage 504 and wafer precision stage 508. Non-isolated base frame 408 supports wafer sub-stage 504. Wafer sub-stage 504 supports wafer precision stage 508. A semiconductor wafer is attached to wafer precision stage 508 for exposure by an illumination source, such as illumination source 902 of FIG. 9.

Reticle precision stage 510 and wafer precision stage 508 are preferably magnetically levitated with respect to reticle sub-stage 506 and wafer sub-stage 504, respectively. The positions of wafer precision stage 508 and reticle precision stage 510 are servo controlled relative to isolated bridge 402, preferably in six degrees of freedom. Laser gages and capacitance gages coupled between isolated bridge 402 and the precision stages can provide feedback for the servos controlling the position of wafer precision stage 508 and reticle precision stage 510. One or more Lorentz actuators 302 drive each of wafer precision stage 508 and reticle precision stage 510 in six degrees of freedom. As shown in FIGS. 6A and 6B, first and second counter-force devices 644 and 646 provide support for the weight of wafer precision stage 508 and reticle precision stage 510, respectively.

In a preferred embodiment, wafer sub-stage 504 and reticle sub-stage 506 are servo controlled to follow wafer precision stage 508 and reticle precision stage 510, respectively, based upon optical sensor feedback. In an embodiment, wafer sub-stage 504 is capable of X and Y travel, and reticle sub-stage 506 is capable of X travel.

No motion loads related to wafer stage components 412 or reticle stage components 410 are directly coupled to the structure of isolated bridge 402. Instead, as previously mentioned, the wafer and reticle stage motion loads appear on the structure of the isolated base frame 408.

A system for control of the position of wafer sub-stage 504 is illustrated in FIGS. 6A and 6B. Relative position sensors 628 track or measure the relative position of wafer sub-stage 504 to wafer precision stage 508. Relative position sensors 628 includes two, or other applicable number of relative position sensors 306, for example. Relative position sensors 628 output a relative position signal to a wafer sub-stage position servo controller 630. Wafer sub-stage position servo controller 630 outputs a control signal to a current drives 632. For example, wafer sub-stage position servo controller 630 provides servo control in two axes (X and Y), or other applicable number of axes. Current drives 632 outputs current drive signals to a linear motors 634. Linear motors 634 is coupled between wafer sub-stage 504 and isolated base frame 408. Linear motors 634 adjust the position of wafer sub-stage 504 relative to wafer precision stage 508.

Motion profile generator 610 provides an antirock compensation signal, as described above, to wafer sub-stage position servo controller 630. Wafer sub-stage position servo controller 630 accounts for the antirock compensation signal in its output wafer precision stage control signal, and the position of wafer sub-stage 504 is adjusted accordingly.

A system for actuator control of wafer precision stage 508 is shown in FIGS. 6A and 6B. A wafer stage metrology 636 is coupled between wafer precision stage 508 and isolated bridge 402. Wafer stage metrology 636 provides position feedback to servos for wafer precision stage 508. For example, wafer stage metrology 636 provides position feedback in six axes, or other applicable number of axes. Wafer stage metrology 636 outputs a wafer stage position signal to a wafer precision stage servo controller 638. Wafer precision stage servo controller 638 outputs a wafer precision stage control signal to current drives 640. For example, wafer precision stage servo controller 638 provides servo control in six axes, or other applicable number of axes. Current drives 640 outputs current drive signals to actuators 642. Actuators 642 includes six, or other applicable number of Lorentz actuators 302, for example. Actuators 642 support and control the position of wafer precision stage 508.

Motion profile generator 610 provides an antirock compensation signal, as described above, to wafer precision stage servo controller 638. Wafer precision stage servo controller 638 accounts for the antirock compensation signal in its output wafer precision stage control signal, and the position of wafer precision stage 508 is adjusted accordingly.

A system for control of the position of reticle sub-stage 506 is also illustrated in FIGS. 6A and 6B. Relative position sensor 648 tracks or measures the relative position of reticle sub-stage 506 to reticle precision stage 510. Relative position sensor 648 includes one or more relative position sensors 306, for example. Relative position sensor 648 outputs a relative position signal to a reticle sub-stage position servo controller 650. Reticle sub-stage position servo controller 650 outputs a control signal to current drives 652. For example, reticle sub-stage position servo controller 650 provides servo control in one axis, or other applicable number of axes. Current drives 652 outputs current drive signals to a linear motors 654. Linear motors 654 is coupled between reticle sub-stage 506 and isolated base frame 408. Linear motors 654 adjust the position of reticle sub-stage 506 relative to reticle precision stage 510.

Motion profile generator 610 provides an antirock compensation signal, as described above, to reticle sub-stage position servo controller 650. Reticle sub-stage position servo controller 650 accounts for the antirock compensation signal in its output reticle sub-stage control signal, and the position of reticle sub-stage 506 is adjusted accordingly.

A system for control of reticle precision stage 510 is shown in FIGS. 6A and 6B. A reticle stage metrology 656 is coupled between reticle precision stage 510 and isolated bridge 402. Reticle stage metrology 656 provides position feedback to servos for reticle precision stage 510. For example, reticle stage metrology 656 provides position feedback in six axes, or other applicable number of axes. Reticle stage metrology 656 outputs a reticle precision stage position signal to a reticle precision stage servo controller 658. Reticle precision stage servo controller 658 outputs a reticle precision stage control signal to current drives 660. For example, reticle precision stage servo controller 658 provides servo control in six axes, or other applicable number of axes. Current drives 660 outputs current drive signals to actuators 662. Actuators 662 includes six, or other applicable number of Lorentz actuators 302, for example. Actuators 662 support and control the position of reticle precision stage 510.

Motion profile generator 610 provides an antirock compensation signal, as described above, to reticle precision stage servo controller 658. Reticle precision stage servo controller 658 accounts for the antirock compensation signal in its output reticle precision stage control signal, and the position of reticle precision stage 510 is adjusted accordingly.

Isolated base frame 408 supports relay 512. Relay 512 includes at least one of the lenses of source optics assembly 904 of FIG. 9, and includes corresponding framing blades used to frame and adjust radiation passing through Relay 512. In relation to lithography system 900, of FIG. 9, relay 512 transmits and controls where illumination from illumination source 902 meets the reticle of reticle precision stage 508, in reticle stage 906. In an embodiment, relay 512 has a magnification of 1×, but can have other magnification factors.

Figure 10A:
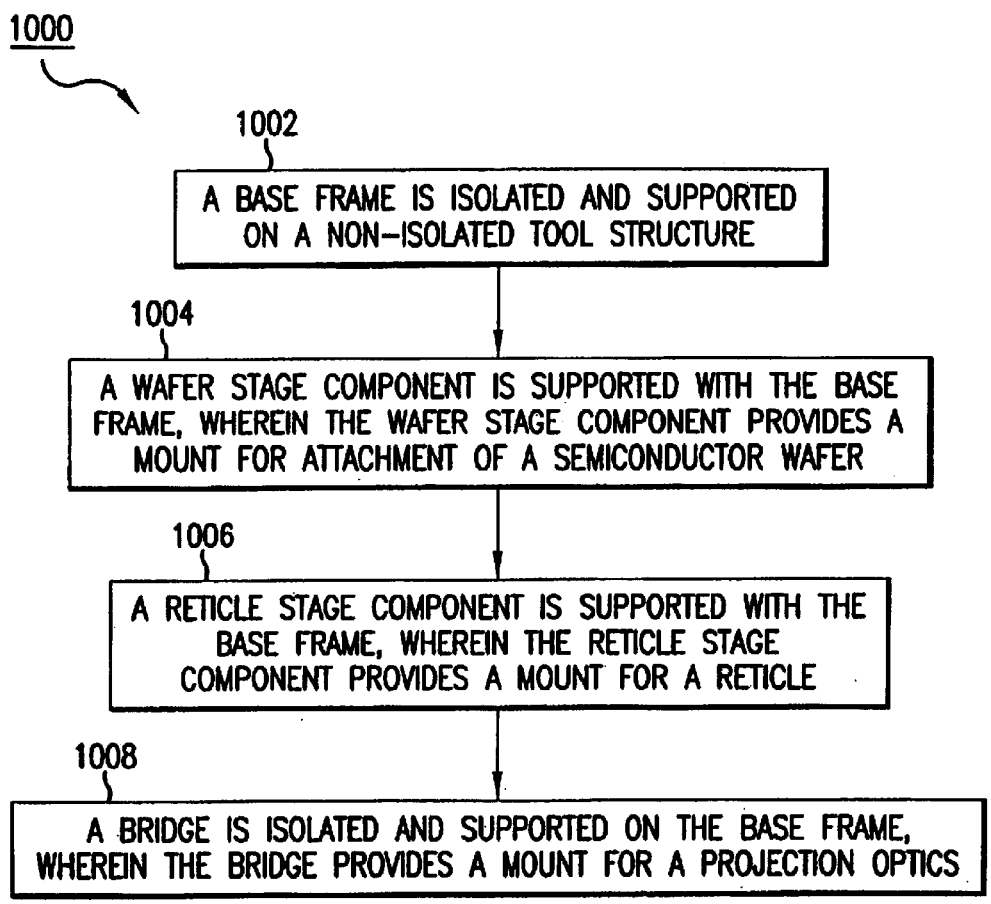
FIGS. 10A–I show flowcharts related to FIGS. 4–6 that provide operational steps for configuring one or more embodiments of the present invention.

FIG. 10A shows a flowchart 1000 providing operational steps for configuring one or more embodiments of the present invention. FIGS. 10B–I show operational steps of further embodiments of the present invention. The steps of FIGS. 10A–I do not necessarily have to occur in the order shown, as will be apparent to persons skilled in the relevant art(s) based on the teachings herein. Other embodiments will be apparent to persons skilled in the relevant art(s) based on the following discussion. These steps are described in detail below.

Flowchart 1000 begins with step 1002. In step 1002, a base frame is isolated and supported on a non-isolated tool structure. For example, the base frame is isolated base frame 408, which is supported on non-isolated tool structure 414, as shown in FIGS. 4, 5A, and 5B. Isolated base frame 408 is supported by second supporting/positioning elements 416, which can include one or more pneumatic isolators 304, for example, and/or other support device.

In step 1004, a wafer stage component is supported with the base frame, wherein the wafer stage component provides a mount for attachment of a semiconductor wafer. For example, the wafer stage component is wafer stage components 412, supported by isolated base frame 408, shown in FIG. 4. A wafer chuck mount in wafer precision stage 508 can be provided in wafer stage components 412, for the attachment of the semiconductor wafer, by suction, for example. The wafer stage component can be included in wafer stage 910 of lithography system 900, for example.

In step 1006, a reticle stage component is supported with the base frame, wherein the reticle stage component provides a mount for a reticle. For example, the reticle stage component is reticle stage components 410, supported by isolated base frame 408, shown in FIG. 4. The reticle stage component can be included in reticle stage 906 of lithography system 900, for example.

In step 1008, a bridge is isolated and supported on the base frame, wherein the bridge provides a mount for a projection optics. For example, the bridge is isolated bridge 402, which is supported on isolated base frame 408, shown in FIGS. 4, 5A, and 5B. The projection optics can be projection optics 502 and can be included in projection optics and metrology components 404. Isolated bridge 402 is supported by first supporting/positioning elements 406, which can include one or more pneumatic isolators 304, for example, and/or other support device.

A dual isolation system lithography tool configured according to the steps of flowchart 1000 can be implemented in a lithography system, such as lithography system 900. Radiation from an illumination source such as illumination source 902 passes through a plane of a mounted reticle at the provided reticle mount in reticle stage components 410, to a surface of a semiconductor wafer attached in wafer stage components 412. A pattern of the mounted reticle is transferred to a surface of the attached semiconductor wafer.

In an embodiment, flowchart 1000 includes the additional step 1010, where the bridge is positioned in six degrees of freedom to remain substantially stationary relative to the non-isolated tool structure.

In an embodiment, flowchart 1000 includes the additional step 1012 where the base frame is positioned in six degrees of freedom to follow the position of the bridge.

In an embodiment, step 1002 includes the step where the base frame is supported with a first pneumatic isolator.

In an embodiment, step 1008 includes the step where the bridge is supported with a second pneumatic isolator.

Figure 10B:
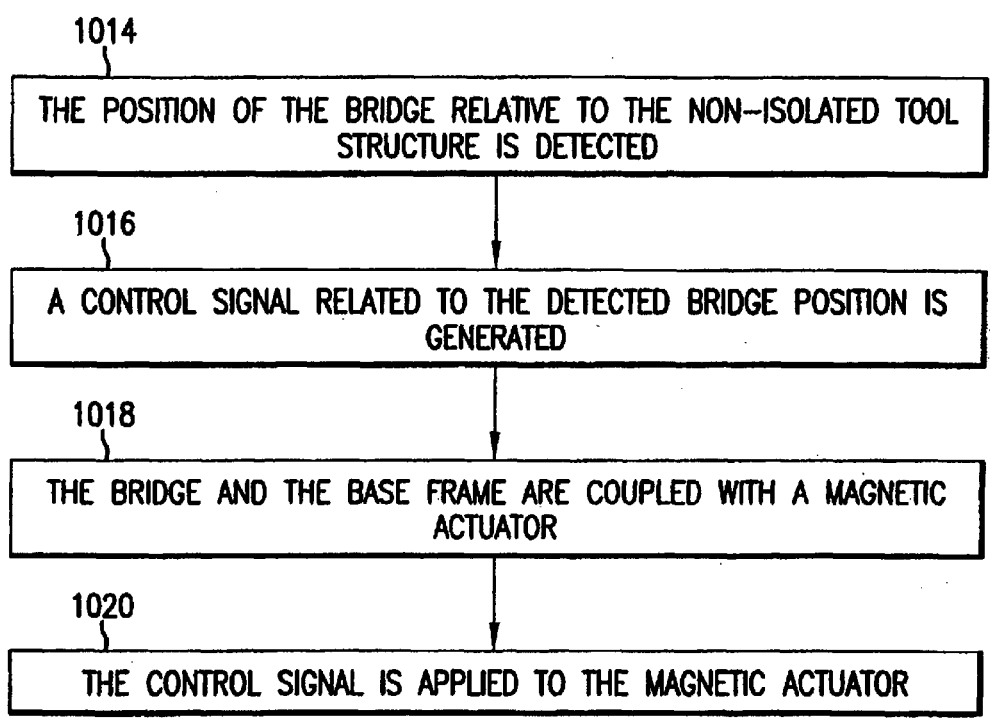

In an embodiment, step 1010 includes the following steps, shown in FIG. 10B.

In step 1014, the position of the bridge relative to the non-isolated tool structure is detected. For example, relative position sensors 602 detect the relative position. Relative position sensors 602 can include one or more of relative position sensor 306.

In step 1016, a control signal related to the detected bridge position is generated. For example, bridge position servo controller 604 can generate the control signal. The control signal can be conditioned by one or more current drives, such as current drives 612.

In step 1018, the bridge and the base frame are coupled with a magnetic actuator. For example, actuators 614 can couple isolated bridge 402 and isolated base frame 408. The magnetic actuator of actuators 614 can be a Lorentz actuator 302.

In step 1020, the control signal is applied to the magnetic actuator. For example, the control signal causes the actuators 614 to adjust the position of isolated bridge 402.

In an embodiment, bridge position servo controller 604 generates a pressure control signal that is received by pneumatic isolators 608. Pneumatic isolators 608 are coupled between isolated bridge 402 and isolated base frame 408. The pressure control signal causes pneumatic isolators 608 to support and/or adjust the position of isolated bridge 402. The pressure control signal can be conditioned by one or more pressure controllers, such as pressure controller 606.

Figure 10C:
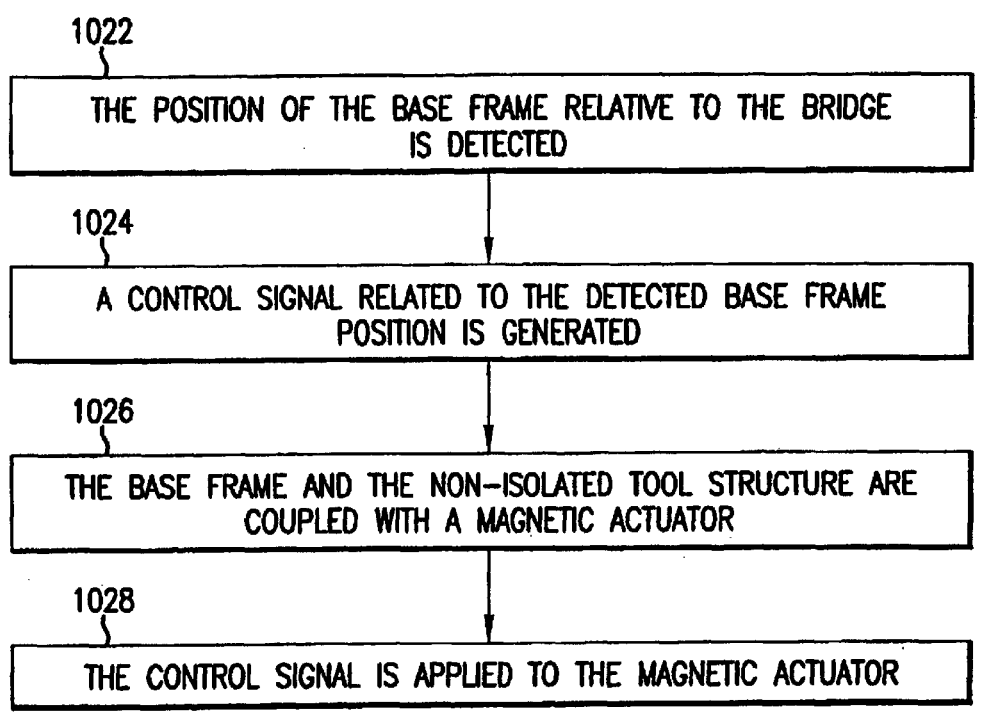

In an embodiment, step 1012 includes the following steps, shown in FIG. 10C.

In step 1022, the position of the base frame relative to the bridge is detected. For example, relative position sensors 616 detect the relative position. Relative position sensors 616 can include one or more of relative position sensor 306.

In step 1024, a control signal related to the detected base frame position is generated. For example, base frame position servo controller 618 can generate the control signal. The control signal can be conditioned by one or more current drives, such as current drives 624.

In step 1026, the base frame and the non-isolated tool structure are coupled with a magnetic actuator. For example, actuators 626 can couple isolated base frame 408 and non-isolated tool structure 414. The magnetic actuator of actuators 626 can be a Lorentz actuator 302.

In step 1028, the control signal is applied to the magnetic actuator. For example, the control signal causes the actuators 626 to adjust the position of isolated base frame 408.

In an embodiment, base frame position servo controller 618 generates a pressure control signal that is received by pneumatic isolators 622. Pneumatic isolators 622 are coupled between isolated base frame 408 and non-isolated tool structure 414. The pressure control signal causes pneumatic isolators 622 to support and/or adjust the position of isolated base frame 408. The pressure control signal can be conditioned by one or more pressure controllers, such as pressure controller 620.

Figure 10D:
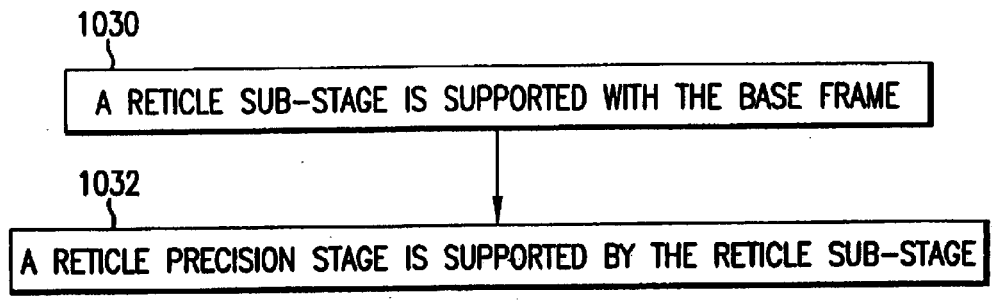

In an embodiment, step 1006 includes the following steps, shown in FIG. 10D.

In step 1030, a reticle sub-stage is supported with the base frame. For example, the reticle sub-stage is reticle sub-stage 506, which is mounted to isolated base frame 408.

In step 1032, a reticle precision stage is supported by the reticle sub-stage. For example, the reticle precision stage can be reticle precision stage 510, supported by reticle sub-stage 506. Reticle precision stage 510 can be magnetically levitated with respect to reticle sub-stage 506, for example.

In an embodiment, flowchart 1000 includes the additional step 1034 where the reticle precision stage is positioned in six degrees of freedom to follow the position of the bridge.

Figure 10E:
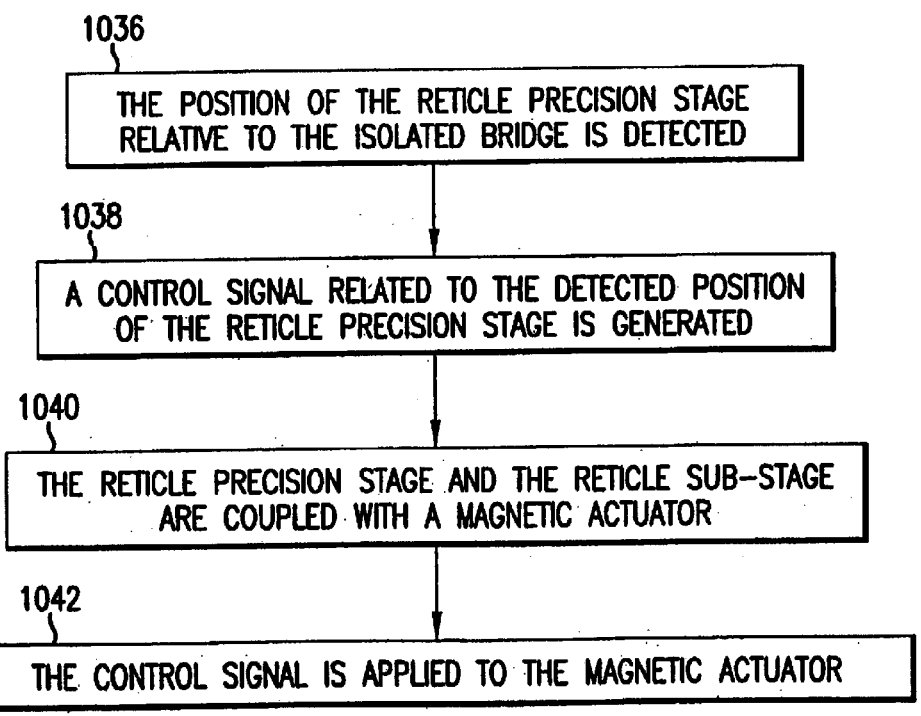

In an embodiment, step 1034 includes the following steps, shown in FIG. 10E.

In step 1036, the position of the reticle precision stage relative to the isolated bridge is detected. For example, reticle stage metrology 656 can detect the relative position. Reticle stage metrology 656 can include one or more of relative position sensor 306, for example.

In step 1038, a control signal related to the detected position of the reticle precision stage is generated. For example, precision reticle stage servo controller 658 can generate the control signal. The control signal can be conditioned by one or more current drives, such as current drives 660.

In step 1040, the reticle precision stage and the reticle sub-stage are coupled with a magnetic actuator. For example, actuators 662 can couple reticle precision stage 510 and reticle sub-stage 506. The magnetic actuators of actuators 662 can be a Lorentz actuator 302.

In step 1042, the control signal is applied to the magnetic actuator. For example, the control signal causes actuators 662 to adjust the position of reticle precision stage 510.

In an embodiment, flowchart 1000 includes the additional step 1044 where the reticle sub-stage is positioned to track the reticle precision stage.

Figure 10F:
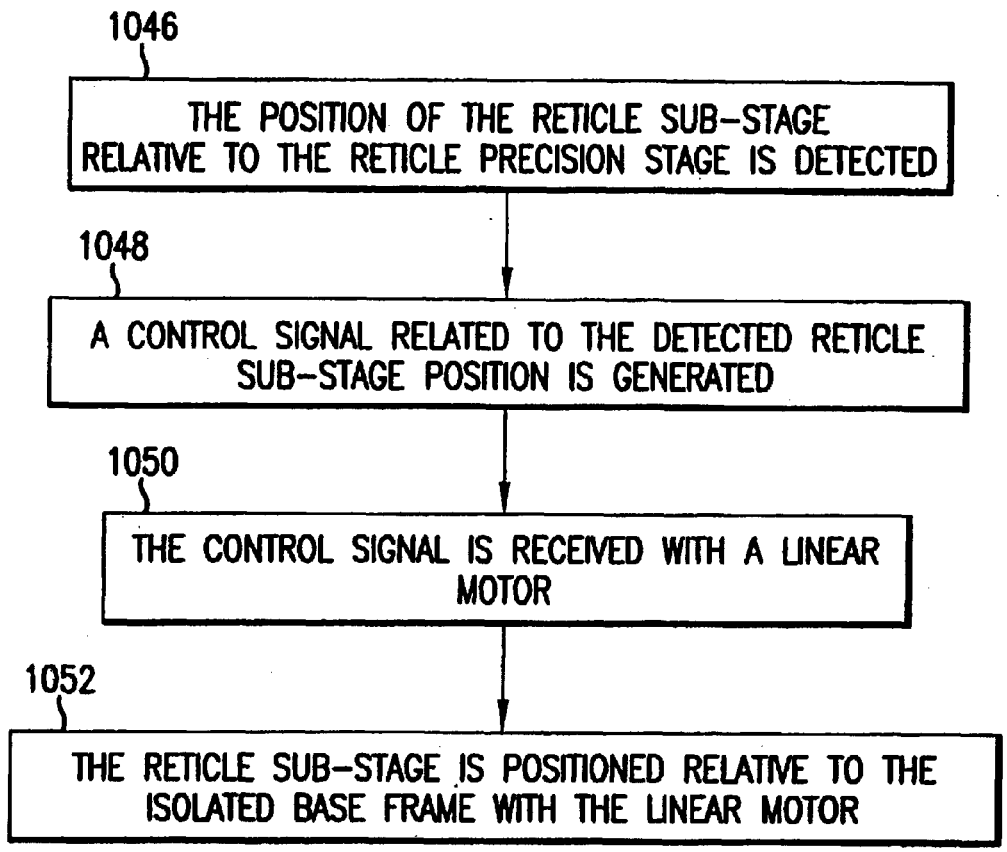

In an embodiment, step 1044 includes the following steps, shown in FIG. 10F.

In step 1046, the position of the reticle sub-stage relative to the reticle precision stage is detected. For example, relative position sensor 648 can detect the relative position. Relative position sensor 648 can include one or more of relative position sensor 306, for example.

In step 1048, a control signal related to the detected reticle sub-stage position is generated. For example, reticle sub-stage position servo controller 650 can generate the control signal. The control signal can be conditioned by one or more current drives, such as current drives 652.

In step 1050, the control signal is received with a linear motor. For example, the control signal is received by linear motors 654.

In step 1052, the reticle sub-stage is positioned relative to the isolated base frame with the linear motor. For example, the control signal causes linear motors 654 to adjust the position of reticle sub-stage 506.

Figure 10G:
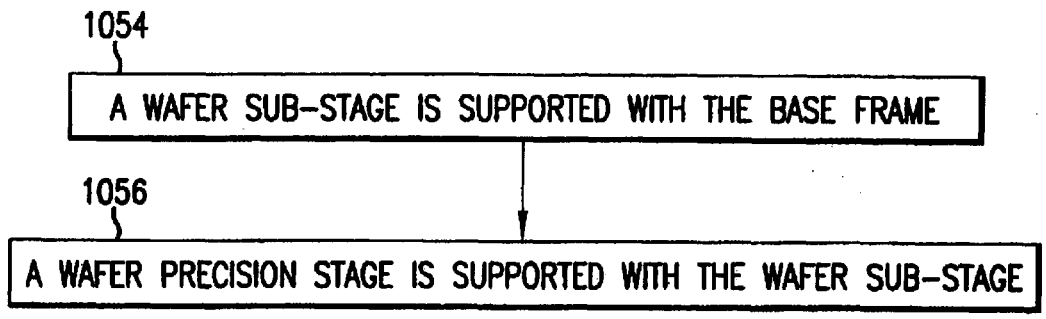

In an embodiment, step 1004 includes the following steps, shown in FIG. 10G.

In step 1054, a wafer sub-stage is supported with the base frame. For example, the wafer sub-stage is wafer sub-stage 504, which is mounted to isolated base frame 408.

In step 1056, a wafer precision stage is supported with the wafer sub-stage. For example, the wafer precision stage can be wafer precision stage 508, supported by wafer sub-stage 504. Wafer precision stage 508 can be magnetically levitated with respect to wafer sub-stage 504, for example.

In an embodiment, flowchart 1000 includes the following step 1058, where the wafer precision stage is positioned in six degrees of freedom to follow the position of the bridge.

Figure 10H:
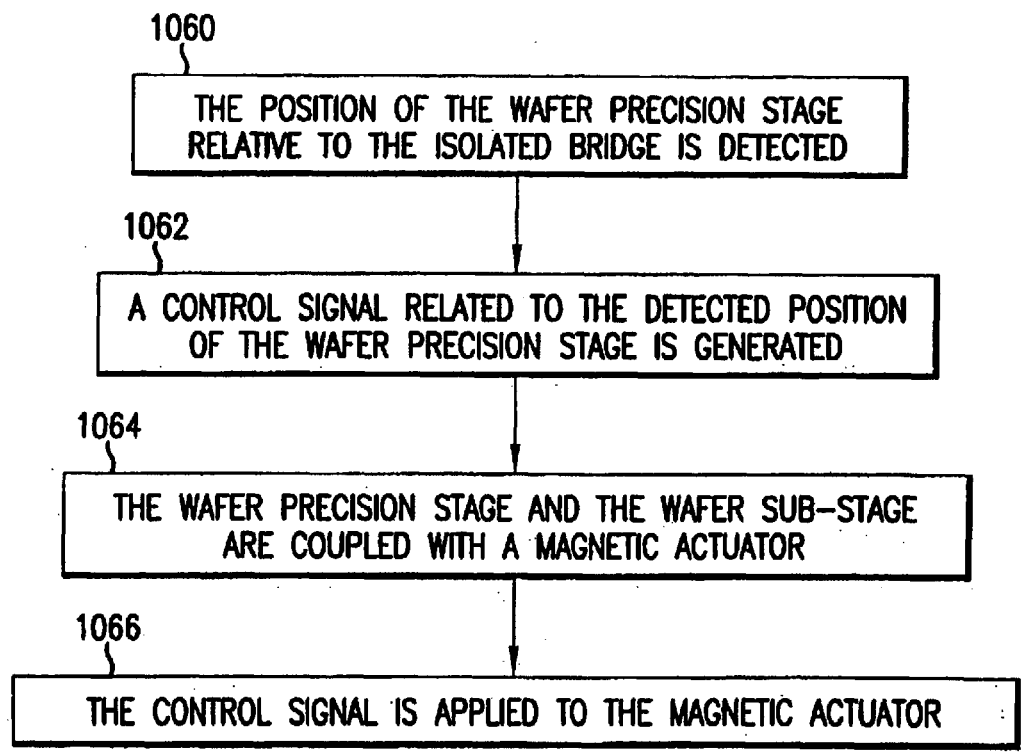

In an embodiment, step 1058 includes the following steps, shown in FIG. 10H.

In step 1060, the position of the wafer precision stage relative to the isolated bridge is detected. For example, wafer stage metrology 636 can detect the relative position. Wafer stage metrology 636 can include one or more of relative position sensor 306, for example.

In step 1062, a control signal related to the detected position of the wafer precision stage is generated. For example, precision wafer stage servo controller 638 can generate the control signal. The control signal can be conditioned by one or more current drives, such as current drives 640.

In step 1064, the wafer precision stage and the wafer sub-stage are coupled with a magnetic actuator. For example, actuators 642 can couple wafer precision stage 508 and wafer sub-stage 504. The magnetic actuator of actuators 642 can be a Lorentz actuator 302.

In step 1066, the control signal is applied to the magnetic actuator. For example, the control signal causes the actuators 642 to adjust the position of wafer precision stage 508.

In an embodiment, flowchart 1000 includes the following step 1068, where the wafer sub-stage is positioned to follow the wafer precision stage.

Figure 10I:
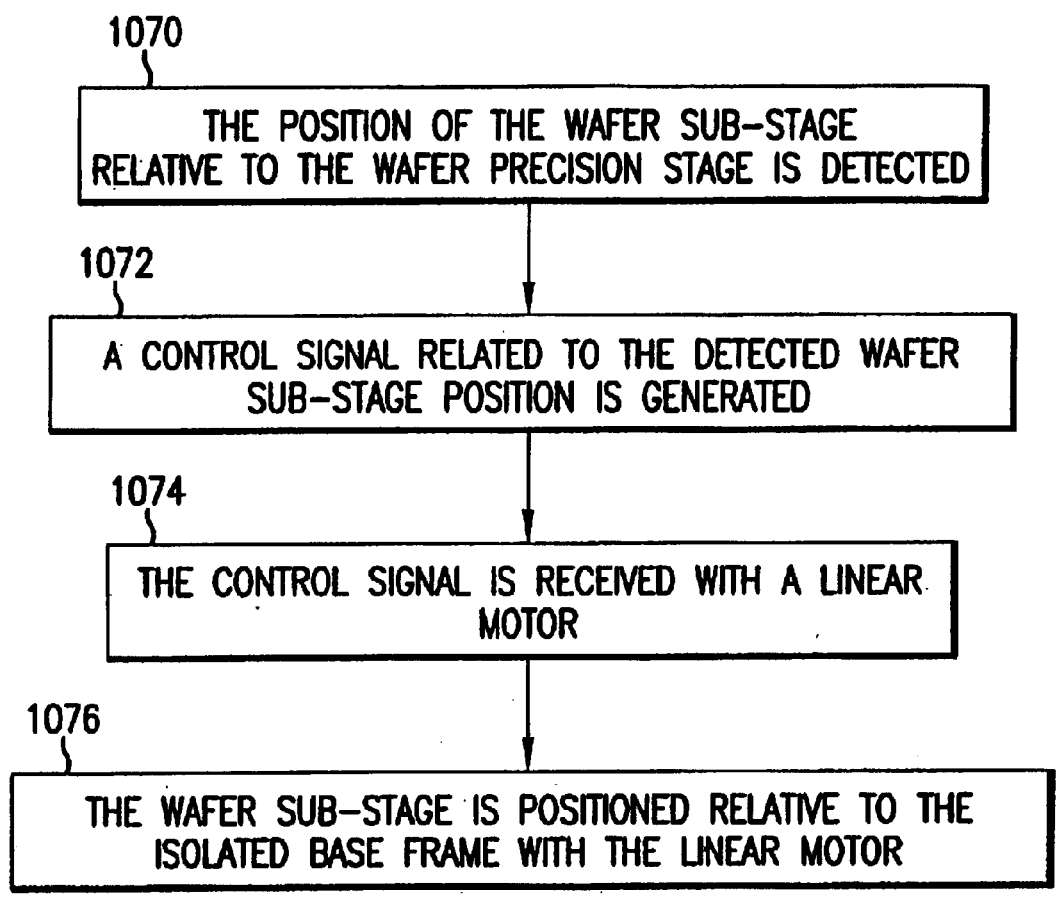

In an embodiment, step 1068 includes the following steps, shown in FIG. 10I.

In step 1070, the position of the wafer sub-stage relative to the wafer precision stage is detected. For example, relative position sensor 628 can detect the relative position. Relative position sensor 628 can include one or more of relative position sensor 306, for example.

In step 1072, a control signal related to the detected wafer sub-stage position is generated. For example, wafer sub-stage position servo controller 630 can generate the control signal. The control signal can be conditioned by one or more current drives, such as current drives 632.

In step 1074, the control signal is received with a linear motor. For example, the control signal is received by linear motors 634.

In step 1076, the wafer sub-stage is positioned relative to the isolated base frame with the linear motor. For example, the control signal causes linear motors 634 to adjust the position of wafer sub-stage 504.

Further embodiments for the dual isolation system lithography tool 400 of the present invention will be apparent to persons skilled in the relevant art(s) from the structures, processes, and teachings presented herein.

5. Advanced Lithography Tool with Separately Isolated Bridge and Relay Structures Embodiments of the Present Invention Structural implementations for the lithography tool with separately isolated bridge and relay structure of the present invention are described at a high-level and at a more detailed level. These structural implementations are described herein for illustrative purposes, and are not limiting. In particular, the present invention as described herein can be achieved using any number of structural implementations. For instance, the present invention as described herein can be implemented in any lithography system requiring a high degree of isolation from outside vibration, and a reduction in relative motion of lithography system components. For example, in embodiments, the present invention can be implemented in a Micrascan and other advanced lithography tool platforms developed by the Lithography Group of Silicon Valley Group, Inc., located in Wilton, Conn.

Embodiments of the present invention provide for a lithography tool with a separately isolated bridge and relay structure. Unlike conventional implementations, the lithography tool of the present invention incorporates separate servo controlled framing blades located in the relay module that are imaged onto the reticle plane. Relative motion between the relay and the bridge must be controlled to the micron level, while motion loads related to framing blades are isolated from the critical bridge structure.

To achieve these design objectives, the lithography tool of the present invention utilizes a dual isolation system, where the bridge and relay structures are independently supported by active six-degrees of freedom isolation systems. The relay is servo controlled to closely track the position of the bridge structure. The relay servo incorporates anti-rock compensation to counter the effects of framing blade motion loads.

Figure 7A:
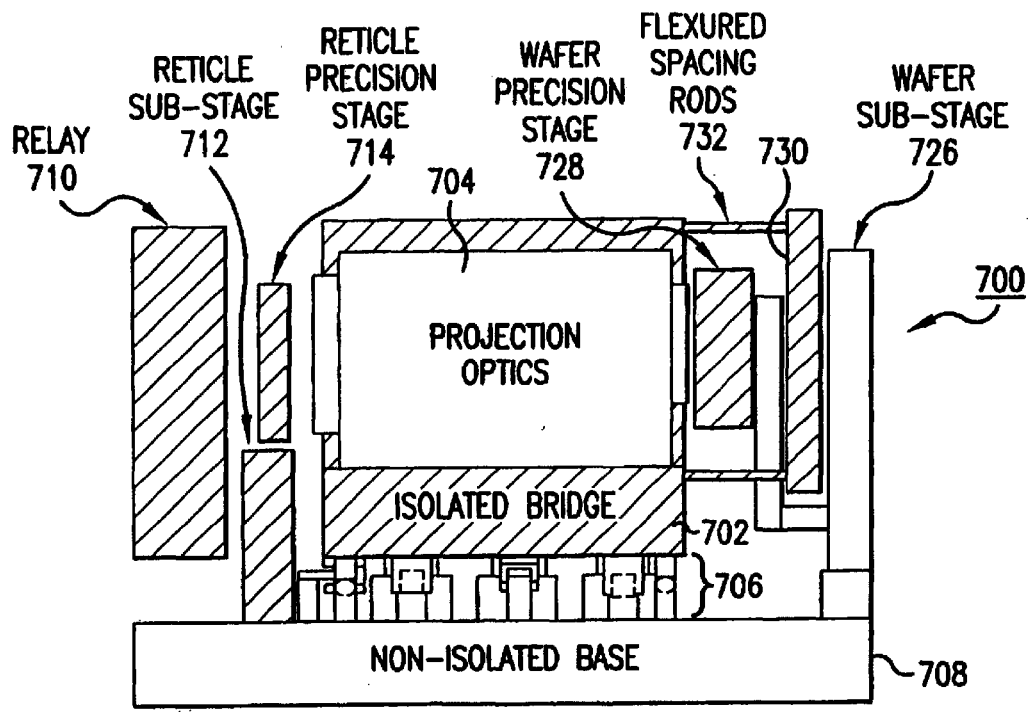
FIGS. 7A and 7B respectively illustrate side and front views of a lithography tool with dual isolation system, according to an embodiment of the present invention.
Figure 7B:
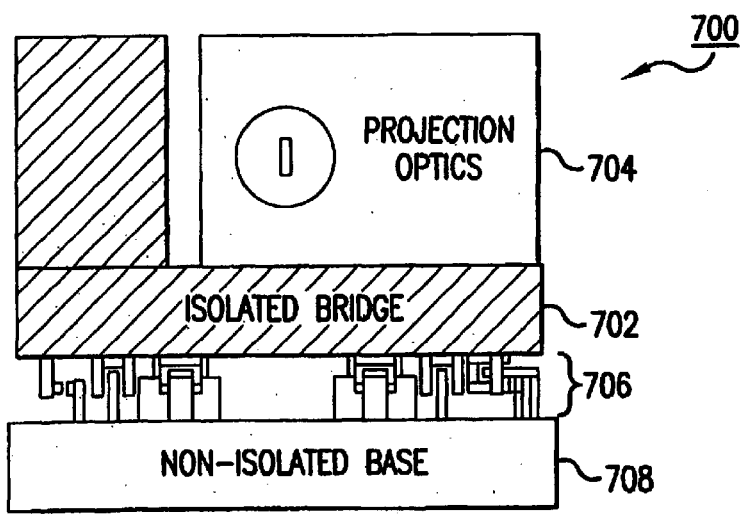

FIGS. 7A and 7B respectively illustrate simplified side and front views of a dual isolation system lithography tool 700, according to a preferred embodiment of the present invention. Lithography tool and dual isolation system 700 includes an isolated bridge 702, a projection optics 704, a supporting/positioning elements 706, a non-isolated base frame 708, a relay 710, a reticle sub-stage 712, a reticle precision stage 714, a wafer sub-stage 726, a wafer precision stage 728, a focus back plate 730, and flexured spacing rods 732. These elements of lithographic tool 700 are more fully described in the following text.

Figure 8A:
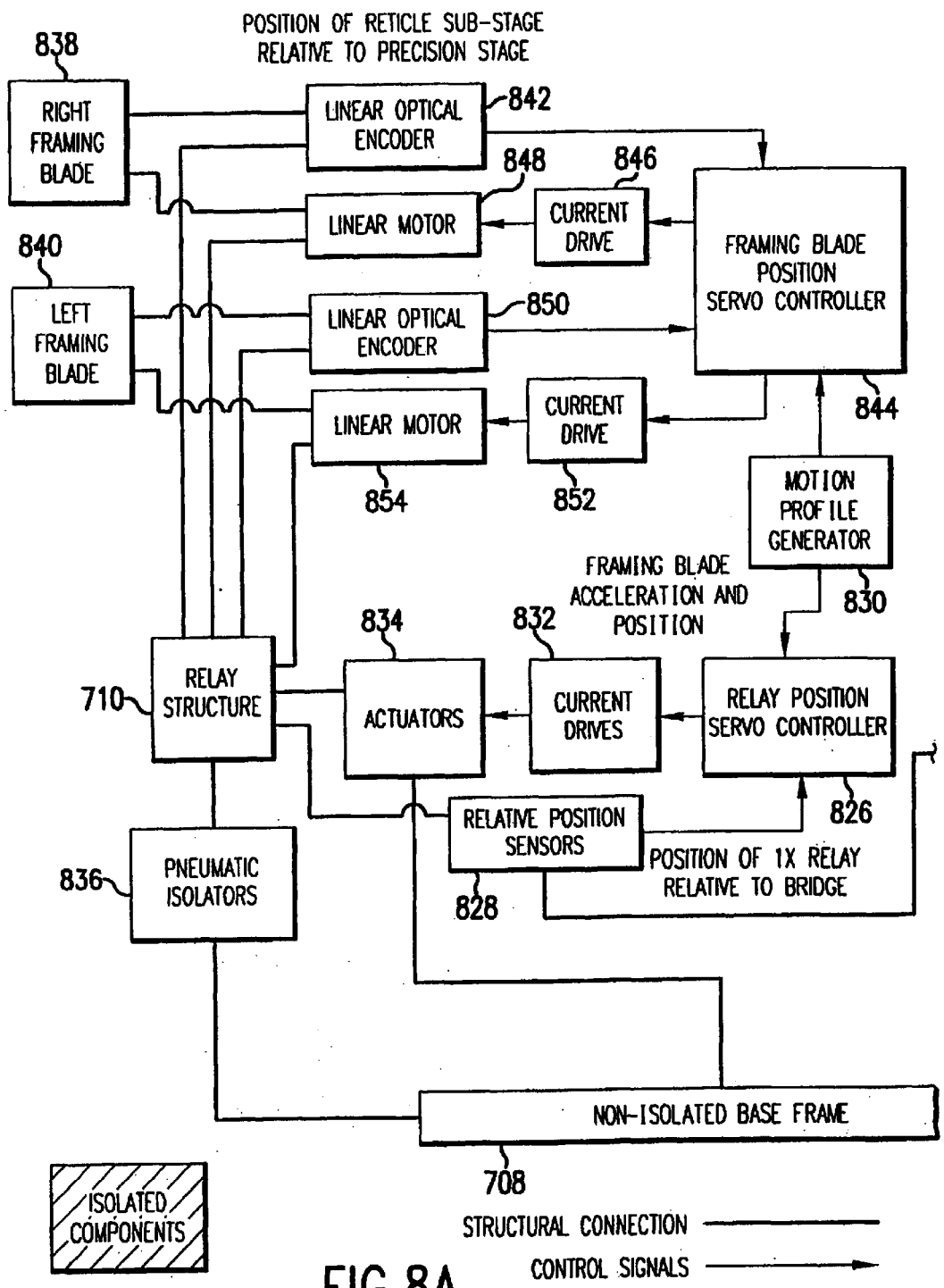
FIGS. 8A and 8B show an example control system block diagram related to a lithography tool with dual isolation system, according to an embodiment of the present invention.
Figure 8B:
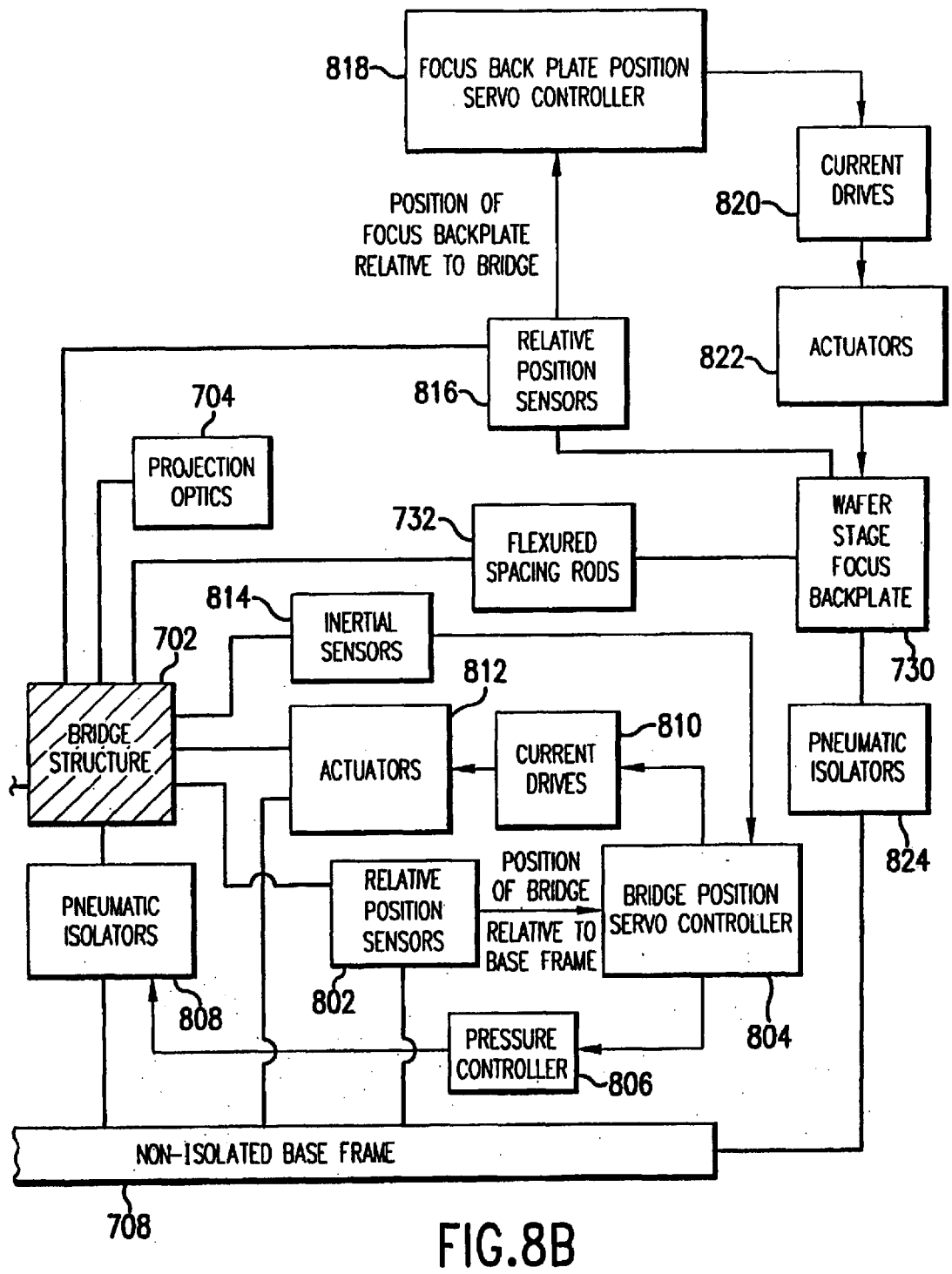

FIGS. 8A and 8B show an exemplary control system block diagram related to lithography tool with dual isolation system 700, according to an embodiment of the present invention. In FIGS. 8A and 8B, connecting lines between system blocks indicate structural connections, and arrows indicate control and/or data signals.

Isolated bridge 702 is coupled to non-isolated base frame 708, through supporting/positioning elements 706. Isolated bridge 702 supports projection optics and metrology components associated with wafer and reticle stage systems. As shown in FIGS. 7A and 7B, isolated bridge 702 supports projection optics 704. Projection optics 704 includes optics necessary to guide radiation transmitted through a mask pattern of a reticle in reticle precision stage 714 to a semiconductor wafer surface in wafer precision stage 728. For instance, projection optics 704 is substantially similar to projection optics 104 of FIGS. 1A and 1B.

Metrology components supported by isolated bridge 702 include, for example, devices related to measuring and tracking the position of components of reticle stage components 410 and wafer stage components 412, shown in FIG. 4. These metrology devices can include any of those described elsewhere herein, or otherwise known.

Non-isolated base frame 708 supports isolated bridge 702 via supporting/positioning elements 706. Supporting/positioning elements 706 support and position isolated bridge 702 in a similar fashion to the manner in which first supporting/positioning elements 406 support and position isolated bridge 402, shown in FIGS. 5A and 5B. As such, supporting/positioning elements 706 can include support devices such as one or more pneumatic isolators 304, positioning devices such as one or more Lorentz actuators 302, and position sensors such as one or more relative position sensors 306, and other counter-force devices and metrology devices described elsewhere herein.

A system for the position control of isolated bridge 702 is illustrated in FIGS. 8A and 8B. Relative position sensors 802 track or measure the relative position of isolated bridge 702 to non-isolated base frame 708. Relative position sensors 802 include six, or other applicable number of relative position sensors 306. Relative position sensors 802 output a relative position signal to a bridge position servo controller 804. Bridge position servo controller 804 outputs a control signal to a pressure controller 806. Pressure controller 806 outputs a pressure signal to a pneumatic isolators 808. Pneumatic isolators 808 includes three, or other number of pneumatic isolators 304, for example. Pneumatic isolators 808 support and adjust the position of isolated bridge 702 relative to non-isolated base frame 708.

A system for actuator control of isolated bridge 702 is shown in FIGS. 8A and 8B. Bridge position servo controller 804 receives a position signal from relative position sensors 802. Bridge position servo controller 804 can also receive a motion control signal from a motion profile generator. Bridge position servo controller 804 outputs a position control signal to a current drives 810. For example, bridge position servo controller 804 provides servo control in six axes, or other applicable number of axes. Current drives 810 outputs current drive signals to an actuators 812. Actuators 812 includes six, or other applicable number of Lorentz actuators 302, for example. Actuators 812 support and control the position of isolated bridge 702.

At higher frequencies, the position of isolated bridge 702 can be stabilized by feedback from one or more inertial sensors 814. Inertial sensors 814 are coupled to isolated bridge 702. Inertial sensors 814 output an inertial sensor signal to bridge position servo controller 804. Bridge position servo controller 804 accounts for the inertial sensor signal in its output position control signal, and the position of isolated bridge 702 is adjusted accordingly by actuators 812.

Wafer sub-stage 726 is mounted on non-isolated base frame 708. Wafer sub-stage 726 supports levitated wafer precision stage 728. In an embodiment, wafer precision stage 728 is movable in six degrees of freedom. A semiconductor wafer is attached to wafer precision stage 508 for exposure by illumination source 902 of FIG. 9. Wafer sub-stage 726 and wafer precision stage 728 are structurally similar to wafer sub-stage 126 and wafer precision stage 128 described above with reference to FIGS. 1A and 1B. The positions of wafer sub-stage 726 and wafer precision stage 728 are monitored and controlled as described above in reference to FIGS. 2A and 2B for wafer sub-stage 126 and wafer precision stage 128, respectively.

Focus back plate 730 with an optically flat surface is mounted to wafer precision stage 728. Focus back plate 730 is attached to isolated bridge 702 by flexured spacing rods 732. In one aspect, unlike conventional systems, lithography tool 700 utilizes a three-axis active position control servo to maintain alignment between wafer stage focus back plate 730, and the structure of isolated bridge 702. Out-of-plane alignment is still maintained by flexured spacing rods 732. The weight of focus back plate 730 is supported by two air bearing counter force cylinders. Pneumatic isolators 824 are shown supporting focus back plate 730 in FIG. 8B. Pneumatic isolators 824 includes two, or other number of pneumatic isolators 304, for example.

A system for actuator control of wafer stage focus backplate 730 is shown in FIGS. 8A and 8B. Relative position sensors 816 are coupled between wafer stage focus backplate 730 and isolated bridge 702. Focus backplate position servo controller 818 receives a position signal from relative position sensors 816. Relative position sensors 816 includes three, or other applicable number of relative position sensors 306, for example. Focus backplate position servo controller 818 can also receive a motion control signal from a motion profile generator. Focus backplate position servo controller 818 outputs a position control signal to a current drives 820. For example, focus backplate position servo controller 818 provides servo control in three axes, or other applicable number of axes. Current drives 820 outputs current drive signals to an actuators 822. Actuators 822 includes three, or other applicable number of Lorentz actuators 302, for example. Actuators 822 support and control the position of wafer stage focus backplate 730.

Reticle sub-stage 712 is mounted on non-isolated base frame 708. Reticle sub-stage 712 supports levitated reticle precision stage 714. Reticle precision stage 714 includes the reticle that has a mask pattern used to etch the semiconductor wafer surface attached to wafer precision stage 728. Reticle sub-stage 712 and reticle precision stage 714 are structurally and operationally similar to reticle sub-stage 506 and reticle precision stage 508 described above with reference to FIGS. 5A and 5B. The positions of reticle sub-stage 712 and reticle precision stage 714 are monitored and controlled as described above in reference to FIGS. 6A and 6B for reticle sub-stage 506 and reticle precision stage 508, respectively.

In an embodiment, relay 710 is an optical relay having a magnification of 1×, but can have other magnification factors. The structure of relay 710 is supported by an active six-degrees of freedom isolation system. Pneumatic isolators 836 are shown in FIG. 8A coupled between non-isolated base frame 708 and relay 710. Pneumatic isolators 836 includes three, or other number of pneumatic isolators 304, for example. Relay 710 is servo controlled to closely track the position of isolated bridge 702, by a relay position servo controller 826. The servo(s) for relay 710 incorporate antirock compensation to counter the effects of framing blade motion loads. Relative motion between relay 710 and isolated bridge 702 is controlled to the micron level, while motion loads related to the framing blades of relay 710 are isolated from the structure of isolated bridge 702.

A system for actuator control of relay structure 710 is shown in FIGS. 8A and 8B. Relative position sensors 828 are coupled between relay 710 and isolated bridge 702. Relative position sensors 828 includes six, or other applicable number of relative position sensors 306, for example. Relay position servo controller 826 receives a position signal from relative position sensors 828. Relay position servo controller 826 can also receive a motion control signal for antirock compensation from a motion profile generator 830. Relay position servo controller 826 outputs a position control signal to a current drives 832. For example, relay position servo controller 826 provides servo control in six axes, or other applicable number of axes. Current drives 832 outputs current drive signals to an actuators 834. Actuators 834 includes six, or other applicable number of Lorentz actuators 302, for example. Actuators 834 support and control the position of relay 710.

Relay 710 includes a right framing blade 838 and a left framing blade 840 that frame and adjust radiation passing through relay 710. The present invention incorporates separate servo controls for right framing blade 838 and left framing blade 840, as shown in FIG. 8A, and described as follows.

A first linear optical encoder 842 is coupled between right framing blade 838 and relay 710. First linear optical encoder 842 tracks the position of right framing blade 838. A framing blade position servo controller 844 receives a position signal from first linear optical encoder 842. Framing blade position servo controller 844 can also receive a motion control signal for antirock compensation related to right framing blade 838 from a motion profile generator 830. Framing blade position servo controller 844 outputs a position control signal to a current drive 846. For example, framing blade position servo controller 844 provides servo control in two axes, or other applicable number of axes. Current drive 846 outputs a current drive signal to a first linear motor 848. First linear motor 848 controls the position of right framing blade 838.

A second linear optical encoder 850 is coupled between left framing blade 840 and relay 710. Second linear optical encoder 850 tracks the position of left framing blade 840. Framing blade position servo controller 844 receives a position signal from second linear optical encoder 850. Framing blade position servo controller 844 can also receive a motion control signal for antirock compensation related to left framing blade 840 from a motion profile generator 830. Framing blade position servo controller 844 outputs a position control signal to a current drive 852. Current drive 852 outputs a current drive signal to a second linear motor 854. Second linear motor 854 controls the position of left framing blade 840.

Figure 11A:
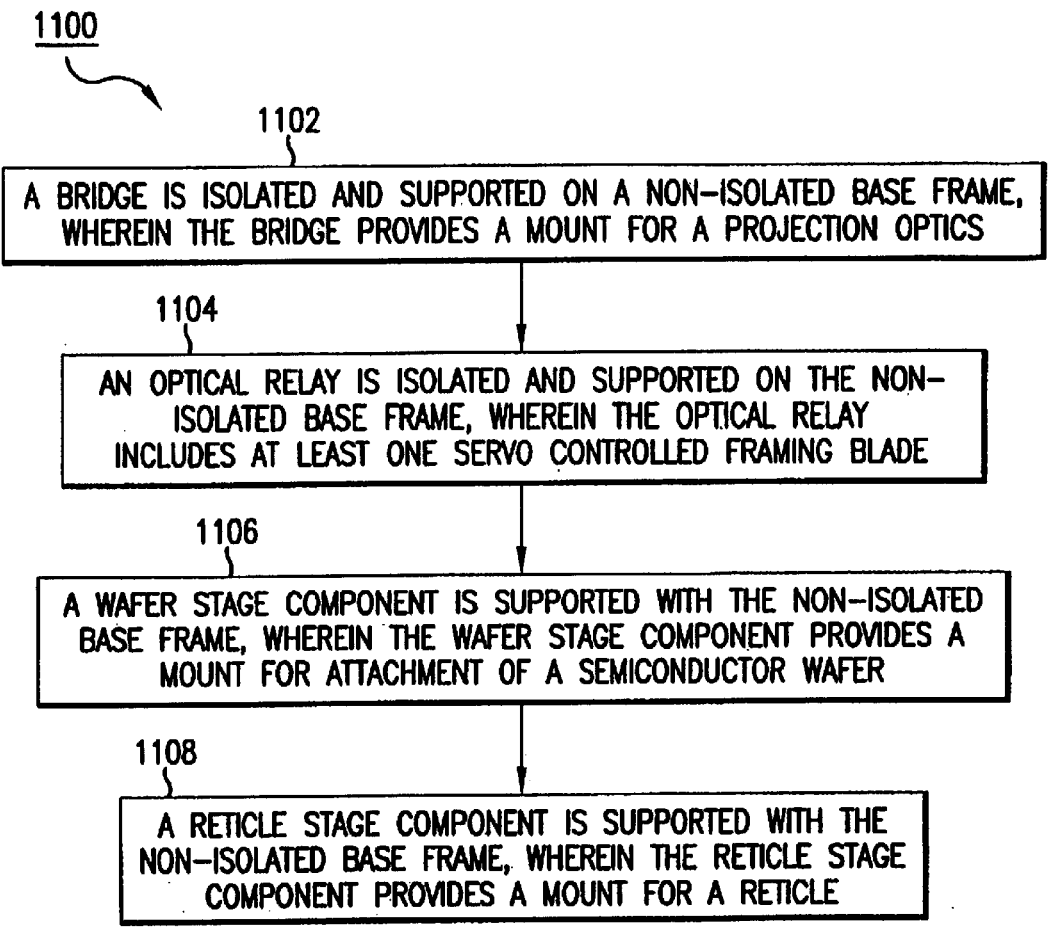
FIGS. 11A–E show flowcharts related to FIGS. 8–9 providing operational steps for configuring one or more embodiments of the present invention.

FIG. 11A shows a flowchart 1100 providing operational steps for configuring one or more embodiments of the present invention. FIGS. 11B–E show operational steps of further embodiments of the present invention. The steps of FIGS. 11A–E do not necessarily have to occur in the order shown, as will be apparent to persons skilled in the relevant art(s) based on the teachings herein. Other embodiments will be apparent to persons skilled in the relevant art(s) based on the following discussion. These steps are described in detail below.

Flowchart 1100 begins with step 1102. In step 1102, a bridge is isolated and supported on a non-isolated base frame, wherein the bridge provides a mount for a projection optics. For example, the bridge is isolated bridge 702, which is supported on non-isolated base frame 708, shown in FIGS. 7A and 7B. The projection optics can be projection optics 704. Isolated bridge 702 is supported by supporting/positioning elements 706, which can include one or more pneumatic isolators 304, for example, and/or other support device.

In step 1104, an optical relay is isolated and supported on the non-isolated base frame, wherein the optical relay includes at least one servo controlled framing blade. For example, the optical relay is relay 710, supported on non-isolated base frame 708. Relay 710 is supported by supporting/positioning elements such as one or more pneumatic isolators 304. In an embodiment, relay 710 has a magnification of 1×, but can have other magnification factors:

In step 1106, a wafer stage component is supported with the non-isolated base frame, wherein the wafer stage component provides a mount for attachment of a semiconductor wafer. For example, the wafer stage component is wafer sub-stage 702, supported by non-isolated base frame 708, shown in FIG. 7A. A wafer chuck can be provided for the attachment of the semiconductor wafer, by suction, for example. The wafer stage component can be included in wafer stage 910 of lithography system 900.

In step 1108, a reticle stage component is supported with the non-isolated base frame, wherein the reticle stage component provides a mount for a reticle. For example, the reticle stage component is reticle sub-stage 712, supported by non-isolated base frame 708, shown in FIG. 7A. The reticle stage component can be included in reticle stage 906 of lithography system 900.

A dual isolation system lithography tool configured according to the steps of flowchart 1100 can be implemented in a lithography system, such as lithography system 900. The at least one servo controlled framing blade is configured such that radiation from an illumination source would be framed and imaged onto a plane at the provided reticle mount. The radiation passes through the reticle plane to a surface of an attached semiconductor wafer. A pattern of a mounted reticle is transferred to an attached semiconductor wafer surface.

In an embodiment, flowchart 1100 includes the additional step where projection optics are mounted to the bridge. For example, projection optics 704 can be mounted to isolated bridge 702.

In an embodiment, flowchart 1100 includes the additional step 1110, where the bridge is positioned in six degrees of freedom to remain substantially stationary relative to the non-isolated base frame.

Figure 11B:
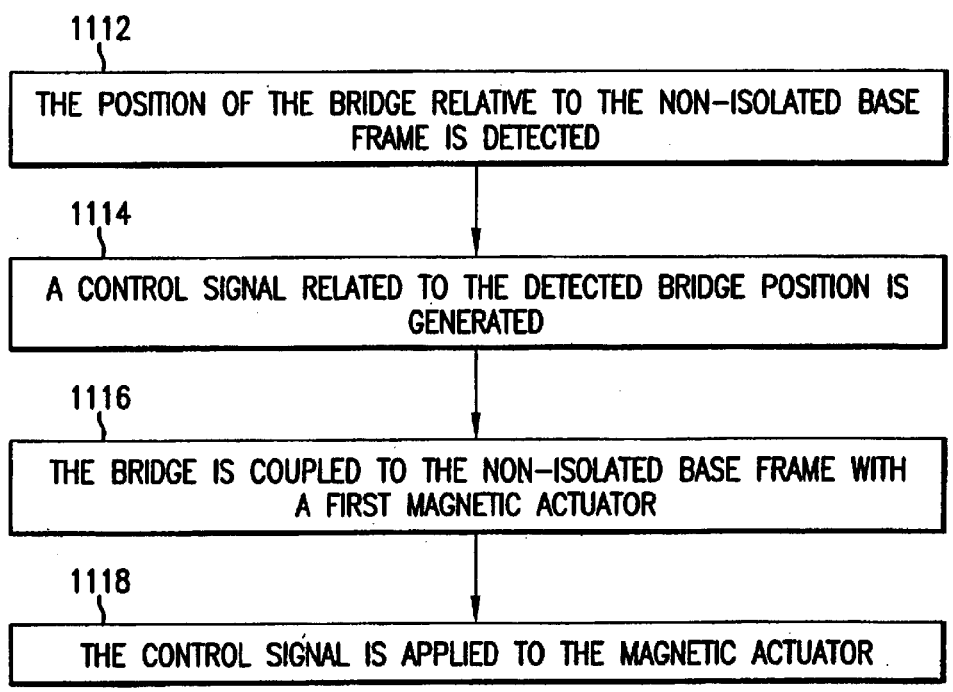

In an embodiment, step 1110 includes the following steps, shown in FIG. 11B.

In step 1112, the position of the bridge relative to the non-isolated base frame is detected. For example, relative position sensors 802 can detect the relative position. Relative position sensors 802 can include one or more of relative position sensor 306, for example.

In step 1114, a control signal related to the detected bridge position is generated. For example, bridge position servo controller 804 can generate the control signal. The control signal can be conditioned by one or more current drives, such as current drives 810.

In step 1116, the bridge is coupled to the non-isolated base frame with a first magnetic actuator. For example, actuators 812 can couple isolated bridge 702 and non-isolated base frame 708. The magnetic actuator of actuators 812 can be a Lorentz actuator 302.

In step 1118, the control signal is applied to the magnetic actuator. For example, the control signal causes the actuators 812 to adjust the position of isolated bridge 702.

In an embodiment, bridge position servo controller 804 generates a pressure control signal that is received by pneumatic isolators 808. Pneumatic isolators 808 are coupled between isolated bridge 702 and non-isolated base frame 708. The pressure control signal causes pneumatic isolators 808 to support and/or adjust the position of isolated bridge 702. The pressure control signal can be conditioned by one or more pressure controllers, such as pressure controller 806.

In an embodiment, flowchart 1100 includes the additional step 1120, where the optical relay is positioned in six degrees of freedom to remain substantially stationary relative to the bridge.

Figure 11C:
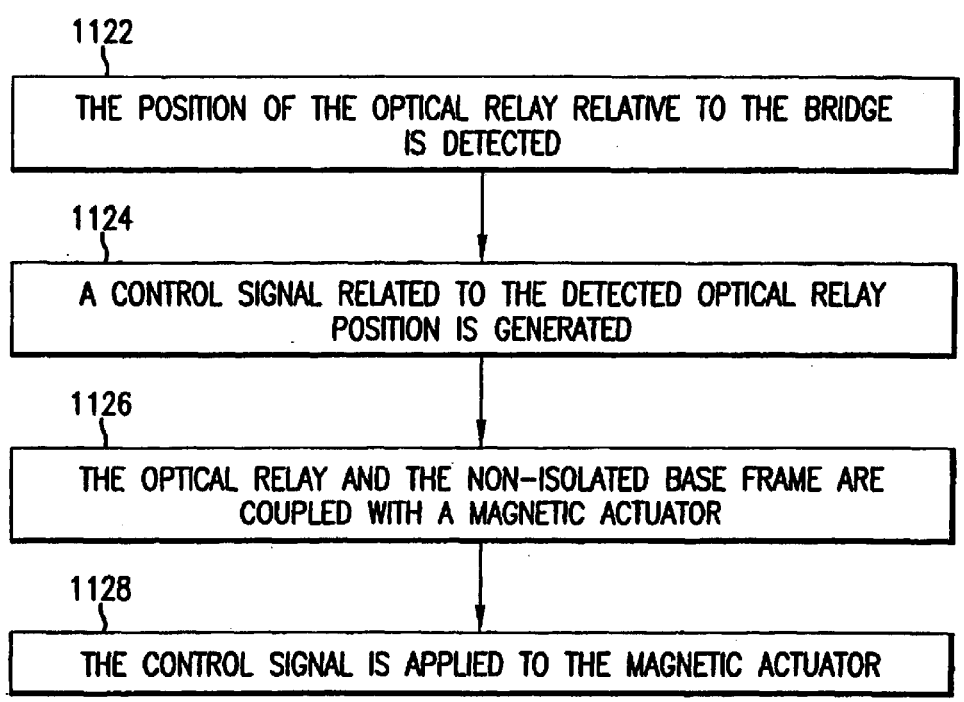

In an embodiment, step 1120 includes the following steps, shown in FIG. 11C.

In step 1122, the position of the optical relay relative to the bridge is detected. For example, relative position sensors 828 can detect the relative position. Relative position sensor 828 can include one or more of relative position sensor 306, for example.

In step 1124, a control signal related to the detected optical relay position is generated. For example, relay position servo controller 826 can generate the control signal. Relay position servo controller 826 can receive a motion control signal for antirock compensation related to relay 710 from motion profile generator 830. Relay position servo controller 826 can compensate for the received motion control signal in the control signal. The control signal can be conditioned by one or more current drives, such as current drives 832.

In step 1126, the optical relay and the non-isolated base frame are coupled with a magnetic actuator. For example, actuators 834 can couple relay 710 and non-isolated base frame 708. The magnetic actuator of actuators 834 can be a Lorentz actuator 302.

In step 1128, the control signal is applied to the magnetic actuator. For example, the control signal causes actuators 834 to adjust the position of relay 710.

Figure 11D:
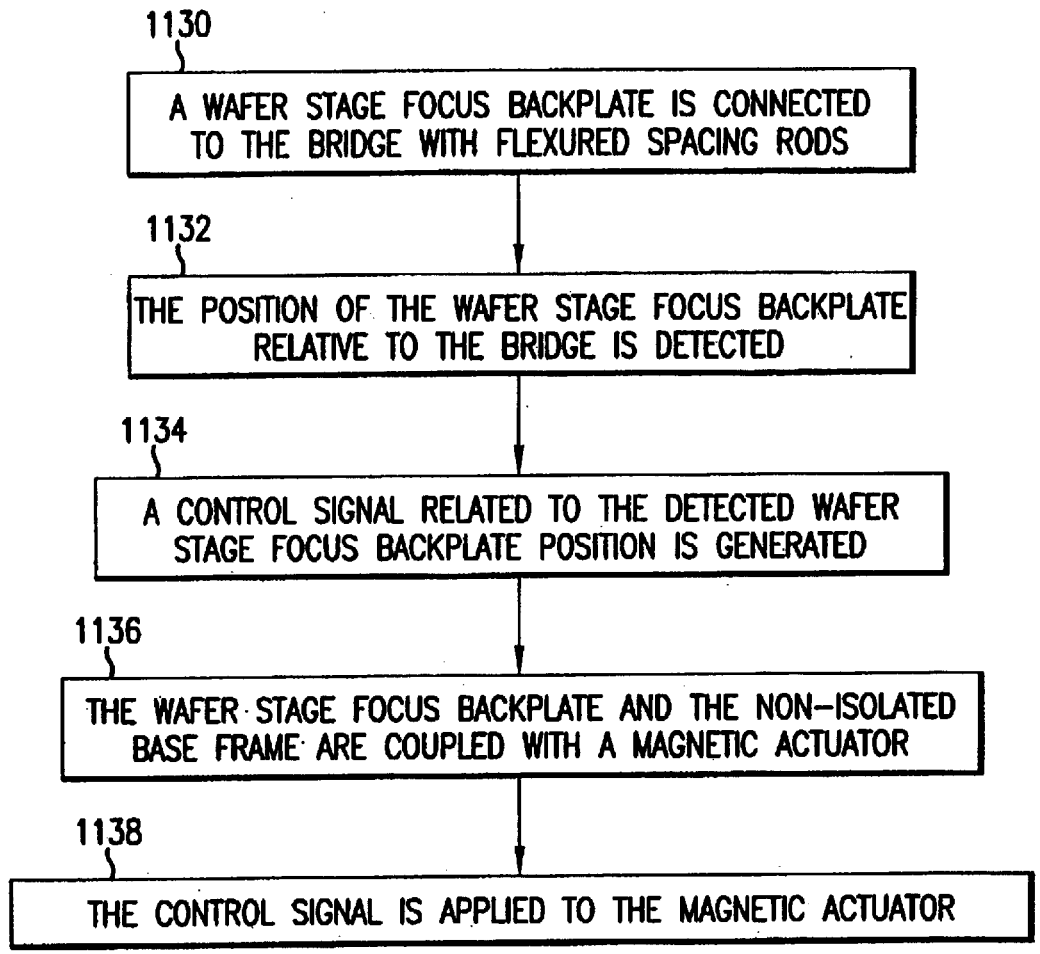
Figure 11E:
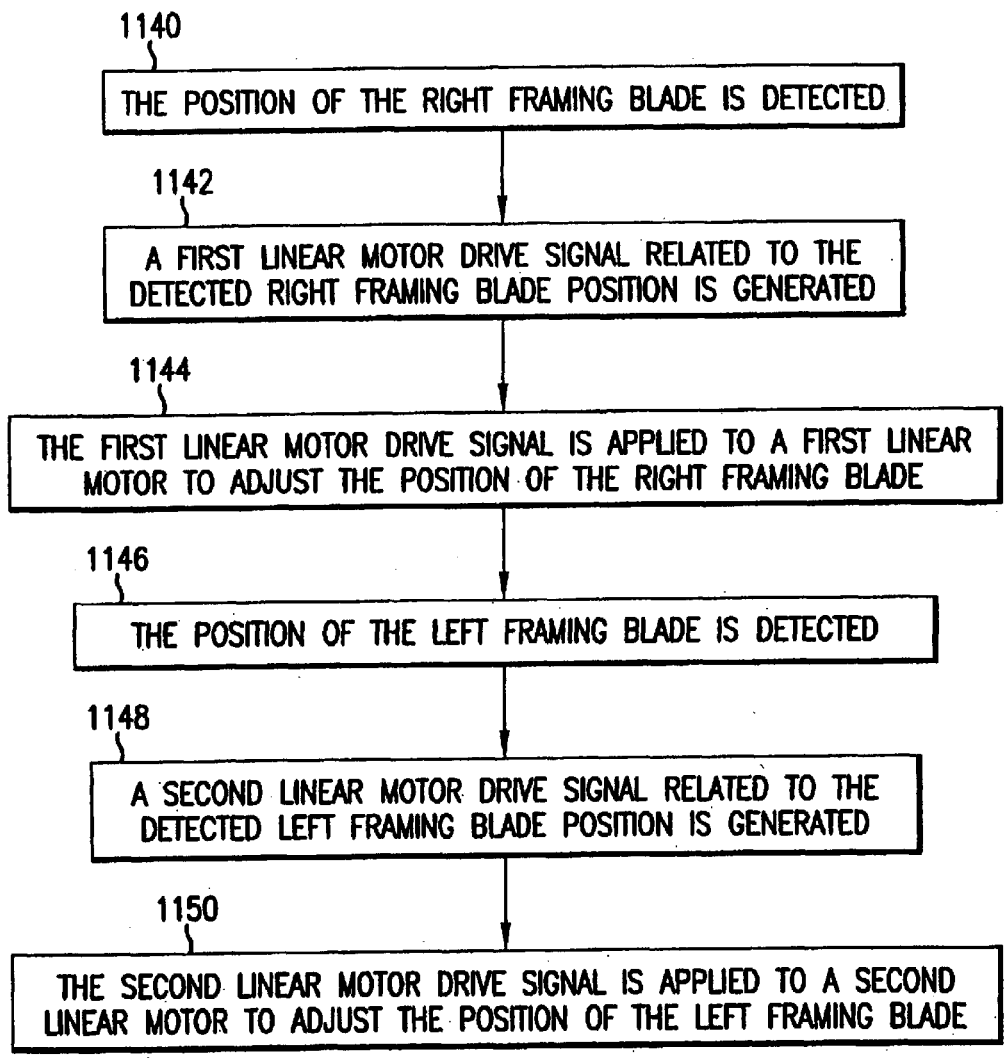

In an embodiment, flowchart 1100 includes the following steps, shown in FIG. 11D.

In step 1130, a wafer stage focus backplate is connected to the bridge with flexured spacing rods. For example, the wafer stage focus backplane is wafer stage focus backplane 730. Wafer stage focus backplane 730 is connected to isolated bridge 702 with flexured spacing rods 732. Alternatively, wafer stage focus backplane 730 can be coupled to isolated bridge 702 by other means than flexured spacing rods 732.

In step 1132, the position of the wafer stage focus backplate relative to the bridge is detected. For example, relative position sensors 816 can detect the relative position. Relative position sensor 816 can include one or more of relative position sensor 306, for example.

In step 1134, a control signal related to the detected wafer stage focus backplate position is generated. For example, focus backplate position servo controller 818 can generate the control signal. The control signal can be conditioned by one or more current drives, such as current drives 820.

In step 1136, the wafer stage focus backplate and the non-isolated base frame are coupled with a magnetic actuator. For example, actuators 822 can couple wafer stage focus backplate 730 and non-isolated base frame 708. The magnetic actuator of actuators 822 can be a Lorentz actuator 302.

In step 1138, the control signal is applied to the magnetic actuator. For example, the control signal causes actuators 822 to adjust the position of wafer stage focus backplate 730.

In an embodiment, the at least one servo controlled framing blade of step 1104 comprises a right framing blade and a left framing blade. In an embodiment, flowchart 1100 includes the following steps, shown in FIG. 11E.

In step 1140, the position of the right framing blade is detected. For example, first linear optical encoder 842 can detect the position of right framing blade 838.

In step 1142, a first linear motor drive signal related to the detected right framing blade position is generated. For example, framing blade position servo controller 844 can generate the drive signal. Framing blade position servo controller 844 can receive a motion control signal for antirock compensation related to right framing blade 838 from motion profile generator 830. Framing blade position servo controller 844 can compensate for the received motion control signal in the drive signal. The first linear motor drive signal can be conditioned by one or more current drives, such as current drive 846.

In step 1144, the linear motor drive signal is applied to a first linear motor to adjust the position of the right framing blade. For example, the drive signal causes first linear motor 848 to adjust the position of right framing blade 838.

In step 1146, the position of the left framing blade is detected. For example, second linear optical encoder 850 can detect the position of left framing blade 840.

In step 1148, a second linear motor drive signal related to the detected left framing blade position is generated. For example, framing blade position servo controller 844 can generate the drive signal. Framing blade position servo controller 844 can receive a motion control signal for antirock compensation related to left framing blade 840 from motion profile generator 830. Framing blade position servo controller 844 can compensate for the received motion control signal in the drive signal. The second linear motor drive signal can be conditioned by one or more current drives, such as current drive 852.

In step 1150, the second linear motor drive signal is applied to a second linear motor to adjust the position of the left framing blade. For example, the drive signal causes second linear motor 854 to adjust the position of left framing blade 840.

Further embodiments for the dual isolation system lithography tool 700 of the present invention will be apparent to persons skilled in the relevant art(s) from the structures, processes, and teachings presented herein.

6. Conclusion

While various embodiments of the present invention have been described above, it should be understood that they have been presented by way of example only, and not limitation. It will be apparent to persons skilled in the relevant art that various changes in form and detail can be made therein without departing from the spirit and scope of the invention. The embodiments described above may be combined in any applicable manner. For instance, in embodiments, a relay, an isolated bridge, and an isolated base frame can each have separate isolation systems in a single lithography tool. Thus, the breadth and scope of the present invention should not be limited by any of the above-described exemplary embodiments, but should be defined only in accordance with the following claims and their equivalents.

What is claimed is:

1. A method for a reducing relative motion between components of a lithography tool, comprising the steps of:

supporting a base frame on a non-isolated tool structure in an isolated manner, wherein the base frame is capable of supporting at least one of a wafer stage component, a reticle stage component, or a source optics assembly component;

supporting a bridge in an isolated manner, wherein the bridge provides a mount for a projection optics and at least one metrology component; and applying a force with at least one positioning element to move the base frame with respect to the bridge in response to at least one feedback control signal, whereby relative motion between the bridge and the base frame is reduced, and isolation between the bridge and the base frame is at least substantially maintained.

2. The method of claim 1, wherein said bridge supporting step comprises:

supporting the bridge on the base frame in an isolated manner.

3. The method of claim 1, wherein said bridge supporting step comprises:

supporting the bridge on the non-isolated tool structure in an isolated manner.

4. The method of claim 1, wherein said applying step comprises:

applying the force to move the base frame in any one of six degrees of freedom relative to the bridge.

5. The method of claim 1, further comprising:

determining the position of the base frame relative to the bridge;

generating position information from the determined position of the base frame relative to the bridge; and using the generated position information to generate the feedback control signal.

6. The method of claim 1, wherein said applying step comprises:

applying the force with the at least one positioning element, wherein the at least one positioning element is located between the base frame and the non-isolated tool structure.

7. The method of claim 1, further comprising:

applying a counterforce to the base frame to compensate for anticipated reaction loads.

8. A lithography apparatus that reduces relative motion between components thereof, comprising:

a base frame supported by a non-isolated tool structure, wherein the base frame is isolated from the non-isolated tool structure, and wherein the base frame is capable of supporting at least one of a wafer stage component, a reticle stage component, and a source optics assembly component;

a bridge that provides a mount for a projection optics and at least one metrology component, wherein said bridge is isolated from said base frame;

a servo controller that generates at least one feedback control signal in response to position information related to said base frame relative to said bridge; and at least one positioning element capable of applying a force to move said base frame with respect to said bridge in response said at least one feedback control signal, whereby relative motion between said bridge and said base frame is reduced.

9. The lithography apparatus of claim 8, wherein said bridge is supported by said base frame, wherein said bridge is isolated from said base frame.

10. The lithography apparatus of claim 8, wherein said bridge is supported by said non-isolated tool structure, wherein said bridge is isolated from said non-isolated tool structure.

11. The lithography apparatus of claim 8, wherein said at least one positioning element comprises at least one pneumatic isolator.

12. The lithography apparatus of claim 8, wherein said at least one positioning element comprises at least one actuator.

13. The lithography apparatus of claim 12, wherein said at least one positioning element further comprises at least one pneumatic isolator.

14. The lithography apparatus of claim 8, wherein said at least one positioning element is coupled between said base frame and said non-isolated tool structure.

15. The lithography apparatus of claim 8, wherein said at least one positioning element positions said bridge in six degrees of freedom relative to said base frame.

16. The lithography apparatus of claim 8, further comprising:
at least one position sensor coupled to said bridge that generates said position information, wherein said position information is used by said servo controller to generate said feedback control signal.

17. The lithography apparatus of claim 8, further comprising:
at least one relative position sensor coupled between said bridge and said base frame to determine a relative position of said base frame to said bridge, wherein said at least one relative position sensor generates at least one relative position signal; and
wherein said servo controller receives said at least one relative position signal.

18. The lithography apparatus of claim 8, further comprising:
at least one inertial sensor coupled to said bridge, wherein said inertial sensor generates at least one inertial sensor signal; and
wherein said servo controller receives said at least one inertial sensor signal.

19. The lithography apparatus of claim 18, further comprising:
a second at least one inertial sensor coupled to said base frame, wherein said second inertial sensor generates a second at least one inertial sensor signal;
wherein said servo controller receives said second at least one inertial sensor signal.

20. The lithography apparatus of claim 8, further comprising:
a motion profile generator that generates a motion profile signal;
wherein said servo controller receives said motion profile signal.

21. The lithography apparatus of claim 12, wherein each actuator of said at least one actuator comprises a magnet and a coil, wherein said magnet is mounted to said non-isolated tool structure, and said coil is mounted to said base frame.

22. The lithography apparatus of claim 12, wherein each actuator of said at least one actuator comprises a magnet and a coil, wherein said magnet is mounted to said base frame, and said coil is mounted to said non-isolated tool structure.

23. The lithography apparatus of claim 17, wherein said at least one relative position sensor comprises a light emitting diode and a photo potentiometer.

24. The lithography apparatus of claim 17, wherein said at least one relative position sensor comprises a capacitance gage.

25. The lithography apparatus of claim 17, wherein said at least one relative position sensor comprises an eddy current gages.

26. The lithography apparatus of claim 17, wherein said at least one relative position sensor comprises a linear variable differential transformer (LVDT).

27. The lithography apparatus of claim 17, wherein said at least one relative position sensor comprises an optical encoder.

28. The lithography apparatus of claim 17, wherein said at least one relative position sensor comprises a laser gage interferometer.

29. The lithography apparatus of claim 17, wherein said at least one relative position sensor comprises a first inertial sensor.

30. The lithography apparatus of claim 8, further comprising:
a wafer stage component supported by said base frame.

31. The lithography apparatus of claim 30, wherein said wafer stage component comprises a wafer sub-stage capable of supporting a wafer precision stage that attaches a semiconductor wafer.

32. The lithography apparatus of claim 8, further comprising:
a reticle stage component supported by said base frame.

33. The lithography apparatus of claim 32, wherein said reticle stage component comprises a reticle sub-stage capable of supporting a reticle precision stage that includes a reticle.

34. The lithography apparatus of claim 8, further comprising:
a source optics assembly component supported by said base frame.

35. The lithography apparatus of claim 8, wherein said source optics assembly component is an optical relay.

36. The lithography apparatus of claim 8, wherein the non-isolated tool structure is the ground.

37. The lithography apparatus of claim 8, wherein the non-isolated tool structure is a special purpose structure.

38. A method for a reducing relative motion between components of a lithography tool, comprising the steps of:
supporting a base frame on a non-isolated tool structure in an isolated manner, wherein the base frame is capable of supporting at least one of a wafer stage component, a reticle stage component, or a source optics assembly component;
supporting a bridge on the frame in an isolated manner, wherein the bridge provides a mount for a projection optics and at least one metrology component; and
applying a force with at least one positioning element to move the base frame with respect to the bridge in response to at least one feedback control signal, whereby relative motion between the bridge and the base frame is reduced, and isolation between the bridge and the base frame is at least substantially maintained.

39. A lithography apparatus that reduces relative motion between components thereof, comprising:
a base frame supported by a non-isolated tool structure, wherein the base frame is isolated from the non-isolated tool structure, and wherein the base frame is capable of supporting at least one of a wafer stage component, a reticle stage component, or a source optics assembly component;
a bridge that provides a mount for a projection optics and at least one metrology component, wherein said bridge is supported by said base frame and said bridge is isolated from said base frame;
a servo controller that generates at least one feedback control signal in response to position information related to said base frame relative to said bridge; and
at least one positioning element capable of applying force to move said base frame with respect to said bridge in response said at least one feedback control signal, whereby relative motion between said bridge and said base frame is reduced.

* * * * *